United States Patent
Aoyama

(10) Patent No.: US 10,031,176 B2
(45) Date of Patent: Jul. 24, 2018

(54) CIRCUIT DEVICE, PHYSICAL QUANTITY DETECTION DEVICE, ELECTRONIC APPARATUS, AND MOVING OBJECT

(71) Applicant: Seiko Epson Corporation, Tokyo (JP)

(72) Inventor: Takashi Aoyama, Chino (JP)

(73) Assignee: Seiko Epson Corporation (JP)

( * ) Notice: Subject to any disclaimer, the term of this patent is extended or adjusted under 35 U.S.C. 154(b) by 166 days.

(21) Appl. No.: 15/067,350

(22) Filed: Mar. 11, 2016

(65) Prior Publication Data

US 2016/0274181 A1 Sep. 22, 2016

(30) Foreign Application Priority Data

Mar. 16, 2015 (JP) ................... 2015-051697

(51) Int. Cl.
| | |
|---|---|
| G01C 17/38 | (2006.01) |
| G01R 31/28 | (2006.01) |
| G01C 19/5614 | (2012.01) |
| G01C 19/5649 | (2012.01) |
| G01C 19/5776 | (2012.01) |

(52) U.S. Cl.
CPC ..... *G01R 31/2829* (2013.01); *G01C 19/5614* (2013.01); *G01C 19/5649* (2013.01); *G01C 19/5776* (2013.01)

(58) Field of Classification Search
CPC ...... G01C 25/005; G01C 25/00; G01C 19/56; G01C 19/5776; G01C 19/5705; G01P 21/00; G01R 31/2829
USPC .................... 73/1.77, 335.02, 664
See application file for complete search history.

(56) References Cited

U.S. PATENT DOCUMENTS

| | | | | |
|---|---|---|---|---|
| 3,282,081 A | * | 11/1966 | Boskovich | G01C 25/005 327/43 |
| 5,506,454 A | * | 4/1996 | Hanzawa | B60R 21/01 180/272 |
| 5,751,154 A | * | 5/1998 | Tsugai | G01D 5/2417 324/661 |
| 6,483,322 B2 | * | 11/2002 | Aoyama | G01P 15/125 324/661 |
| 7,168,320 B2 | * | 1/2007 | Murata | G01P 15/125 73/514.32 |

(Continued)

FOREIGN PATENT DOCUMENTS

| | | |
|---|---|---|
| JP | 2008-122122 A | 5/2008 |
| JP | 2008-298709 A | 12/2008 |
| JP | 2012-044571 A | 3/2012 |

*Primary Examiner* — Eric S McCall
*Assistant Examiner* — Mohammed E Keramet-Amircola
(74) *Attorney, Agent, or Firm* — Harness, Dickey & Pierce, P.L.C.

(57) ABSTRACT

A circuit device includes a detection circuit to which first and second detection signals forming differential signals are input from a physical quantity transducer and a diagnosis circuit. The detection circuit includes first and second charge/voltage conversion circuits. The diagnosis circuit includes a first capacitor which is provided between a first node and a first input node to which the first detection signal is input and a second capacitor which is provided between the first node and a second input node to which the second detection signal is input and has a different capacitor value from the first capacitor. In a diagnosis mode, a diagnosis signal is input to the first node.

20 Claims, 12 Drawing Sheets

(56) References Cited

U.S. PATENT DOCUMENTS

| | | | | |
|---|---|---|---|---|
| 7,432,724 B2* | 10/2008 | Goto | ............... | G01R 27/2605 |
| | | | | 324/658 |
| 7,628,073 B2* | 12/2009 | Aoyama | ............... | G01P 15/125 |
| | | | | 73/1.38 |
| 7,795,881 B2* | 9/2010 | Masuda | ............... | G01P 15/125 |
| | | | | 324/661 |
| 9,698,686 B2* | 7/2017 | Maki | ............... | H02M 3/158 |
| 9,892,857 B2* | 2/2018 | Tanaka | ............... | H01G 4/40 |
| 2009/0013785 A1* | 1/2009 | Yoshida | ............... | G01C 19/56 |
| | | | | 73/514.16 |
| 2011/0156205 A1* | 6/2011 | Maki | ............... | H01L 23/5223 |
| | | | | 257/531 |
| 2013/0271876 A1* | 10/2013 | Hosotani | ............... | H02H 3/08 |
| | | | | 361/18 |
| 2014/0305185 A1* | 10/2014 | Maki | ............... | H03M 1/0629 |
| | | | | 73/1.37 |
| 2015/0114083 A1* | 4/2015 | Nakajima | ............... | G01C 19/5776 |
| | | | | 73/1.82 |

* cited by examiner

CIRCUIT DEVICE, PHYSICAL QUANTITY DETECTION DEVICE, ELECTRONIC APPARATUS, AND MOVING OBJECT

BACKGROUND

1. Technical Field

The present invention relates to a circuit device, a physical quantity detection device, an electronic apparatus, and a moving object.

2. Related Art

In the related art, circuit devices detecting physical quantities based on detected signals from physical quantity transducers are known. For example, the circuit devices such as gyro sensors detect angular velocities or the like as physical quantities. The gyro sensors are embedded in, for example, electronic apparatuses such as digital cameras or smartphones or moving objects such as vehicles or air planes, and camera shake correction, posture control, GPS autonomous navigation, or the like are performed using physical quantities such as detected angular velocities.

The technology of the related art in which an I/V conversion circuit (Q/V conversion circuit) in a circuit device of such a gyro sensor is evaluated is disclosed in JP-A-2008-298709.

In the technology of the related art, an evaluation terminal evaluating the I/V conversion circuit provided at an initial stage of a detection circuit is provided in the circuit device apart from a detection terminal to which a physical quantity transducer is connected. Then, an evaluation voltage signal is input from an external tester of the circuit device to the I/V conversion circuit via the evaluation terminal so that characteristics of the I/V conversion circuit are evaluated. For example, it is evaluated whether gain and frequency characteristics of the I/V conversion circuit are proper.

However, the method of the technology of the related art is a method of evaluating characteristics of the I/V conversion circuit at the time of manufacturing of the circuit device or before manufacturing of the circuit device and is not a method of realizing self-diagnosis of the circuit device at the time of an actual operation. This method is also a method of individually evaluating only the I/V conversion circuit in the detection circuit and is not a method of diagnosing the entire detection circuit. For example, when a physical quantity detection device such as a gyro sensor is embedded in an automobile or the like, the detection circuit preferably performs self-diagnosis to detect whether a detection circuit of a circuit device normally operates whenever power is supplied. However, such self-diagnosis may not be realized in the method of the technology of the related art.

SUMMARY

An advantage of some aspects of the invention is to provide a circuit device, a physical quantity detection device, an electronic apparatus, and a moving object capable of appropriately diagnosing whether a detection circuit of the circuit device normally operates.

The invention can be implemented as the following forms or aspects.

A circuit device according to an aspect of the invention includes: a detection circuit to which first and second detection signals forming differential signals are input from a physical quantity transducer; and a diagnosis circuit of the detection circuit. The detection circuit includes a first charge/voltage conversion circuit to which the first detection signal is input, and a second charge/voltage conversion circuit to which the second detection signal is input. The diagnosis circuit includes a first capacitor which is provided between a first node and a first input node of the first charge/voltage conversion circuit to which the first detection signal is input, and a second capacitor which is provided between the first node and a second input node of the second charge/voltage conversion circuit to which the second detection signal is input and has a different capacitor value from the first capacitor. In a diagnosis mode, a diagnosis signal is input to the first node.

According to the aspect of the invention, the first and second capacitors are provided in the diagnosis circuit to correspond to the first and second charge/voltage conversion circuits provided in the detection circuit. Specifically, the first capacitor is provided between the first node and the first input node which is the input node of the first charge/voltage conversion circuit. The second capacitor is provided between the first node and the second input node which is the input node of the second charge/voltage conversion circuit. The capacitance value of the second capacitor is different from the capacitance value of the first capacitor. The diagnosis signal at the time of the diagnosis mode is input to the first node which is the other-end sides of the first and second capacitors. In this way, for example, the signal (pseudo-desired signal for diagnosis) based on the diagnosis signal can be supplied to the detection circuit at the time of the diagnosis mode. Accordingly, it is possible to appropriately diagnose whether the detection circuit of the circuit device normally operates in the diagnosis mode of the circuit device, and thus it is possible to improve reliability or the like.

In the aspect of the invention, the circuit device may further include: a first terminal to which the first detection signal is input; and a second terminal to which the second detection signal is input. The diagnosis circuit may include a first switch element which is provided between one end of the first capacitor and the first input node, a second switch element which is provided between one end of the second capacitor and the second input node, a third switch element which is provided between the first terminal and the first input node, and a fourth switch element which is provided between the second terminal and the second input node.

In this way, the signals based on the diagnosis signal are input to the first and second input nodes of the first and second charge/voltage conversion circuits via the first and second switch elements. The first and second detection signals from the physical quantity transducer can be input to the first and second input nodes via the third and fourth switch elements.

In the aspect of the invention, in the diagnosis mode, the first and second switch elements may be turned on and the third and fourth switch elements may be turned off.

In this way, at the time of the diagnosis mode, the one ends of the first and second capacitors can be electrically connected to the first and second input nodes by turning on the first and second switch elements, while the first and second terminals for inputting the first and second detection signals can be electrically disconnected from the first and second input nodes by turning off the third and fourth switch elements.

In the aspect of the invention, during a normal operation period in which the detection circuit performs a detection operation, the first and second switch elements may be turned off and the third and fourth switch elements may be turned on.

In this way, the first and second detection signals from the physical quantity transducer are input to the detection circuit via the turned-on third and fourth switch elements during the normal operation period, so that the detection operation of the detection circuit can be performed based on the first and second detection signals.

In the aspect of the invention, after supply of power and before a normal operation period in which the detection circuit performs a detection operation, the first and second switch elements may be turned on.

In this way, it is possible to diagnose the detection circuit based on the diagnosis signal, for example, whenever power of the circuit device is supplied, and thus it is possible to improve the reliability or the like.

In the aspect of the invention, the circuit device may further include a control unit that performs control such that switch elements are turned on or off. The diagnosis circuit may include a first switch element which is provided between one end of the first capacitor and the first input node, and a second switch element which is provided between one end of the second capacitor and the second input node. After supply of power and before a normal operation period in which the detection circuit performs a detection operation, the control unit may turn on the first and second switch elements.

In this way, after the supply of the power and before the normal operation period, the one ends of the first and second capacitors are electrically connected to the first and second input nodes of the first and second charge/voltage conversion circuits by turning on the first and second switch elements. For example, whenever the power of the circuit device is supplied, the detection circuit can be diagnosed based on the diagnosis signal.

In the aspect of the invention, the circuit device may further include a driving circuit which drives the physical quantity transducer. A signal based on a signal from the driving circuit is input as the diagnosis signal to the first node.

In this way, by inputting the diagnosis signal to the first node on the other-end sides of the first and second capacitors using the signals from the driving circuit, it is possible to diagnose the detection circuit.

In the aspect of the invention, the signal of which the voltage level of the signal from the driving circuit is converted may be input as the diagnosis signal to the first node.

In this way, it is possible to convert the voltage level of the diagnosis signal to an appropriate level. For example, it is possible to suppress a situation in which the operational amplifier included in the detection circuit operates in a saturation region.

In the aspect of the invention, the detection circuit may include a synchronization detection circuit which performs synchronization detection based on a synchronization signal from the driving circuit. The diagnosis signal may be a signal having the same phase as the synchronization signal.

In this way, it is possible to extract the signal (desired signal for diagnosis) supplied to the detection circuit based on the diagnosis signal through synchronization detection by the synchronization detection circuit, and it is possible to output the detection result.

In the aspect of the invention, the detection circuit may include a differential amplification circuit which is provided on a rear side of the first and second charge/voltage conversion circuits and perform differential amplification on signals output from the first and second charge/voltage conversion circuits.

In this way, the signal having the differential component according to a capacitance value difference between the first and second capacitors can be output from the differential amplification circuit.

In the aspect of the invention, a detection result in the detection circuit in the diagnosis mode may be output.

In this way, it is possible to monitor the detection result in the detection circuit in the diagnosis mode and it is possible to determine whether the detection circuit normally operates.

In the aspect of the invention, the circuit device may further include a register unit which outputs the detection result. The detection circuit includes an A/D conversion circuit which performs A/D conversion on a detection result signal in the detection circuit. In the register unit, diagnosis result data obtained by performing the A/D conversion on the detection result signal in the diagnosis mode may be set as the detection result.

In this way, the detection result in the diagnosis mode can be delivered to the outside via the register unit as the diagnosis result data of the digital data.

A physical quantity detection device according to another aspect of the invention includes the circuit device described above and the physical quantity transducer.

An electronic apparatus according to another aspect of the invention includes the circuit device described above.

A moving object according to another aspect of the invention includes the circuit device described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail. The embodiments to be described below do not appropriately limit content of the invention described in the appended claims, but all of the configurations to be described in the embodiments may not be requisites as resolutions of the invention.

1. Circuit Device

Figure 1:
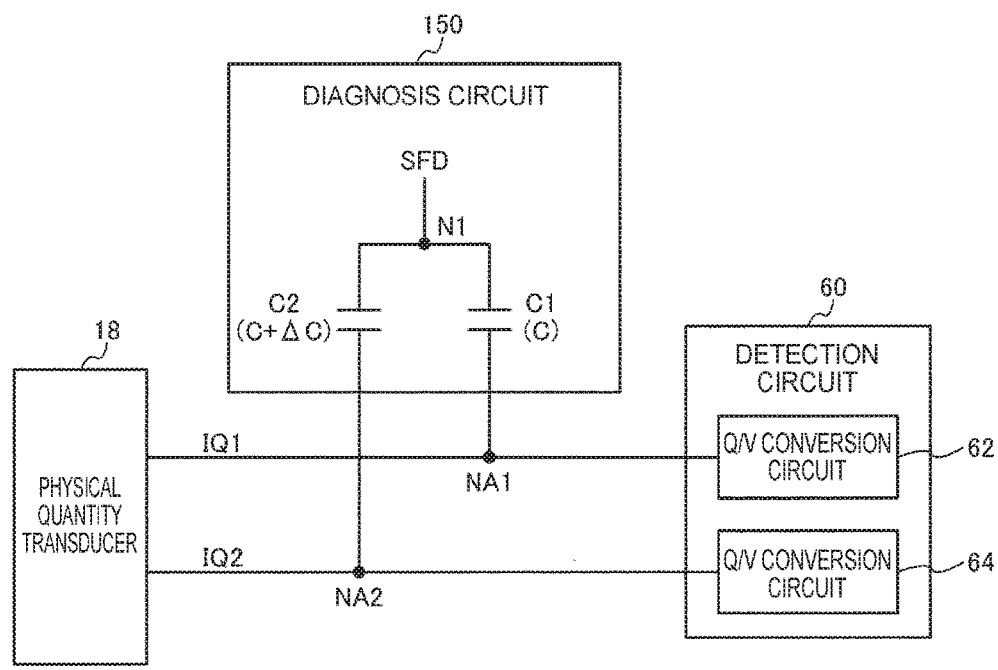
FIG. 1 is a diagram illustrating a basic configuration example of a circuit device according to an embodiment.

FIG. 1 is a diagram illustrating a basic configuration example of a circuit device according to an embodiment. The circuit device according to the embodiment includes a detection circuit 60 and a diagnosis circuit 150.

A first detection signal IQ1 and a second detection signal IQ2 forming differential signals are input from a physical quantity transducer 18 to the detection circuit 60. The physical quantity transducer 18 is a device (sensor) that converts a physical quantity such as an angular velocity, acceleration, or a velocity into an electric signal (a charge signal, a current signal, or the like). The first detection signal IQ1 and the second detection signal IQ2 are signals having mutually reverse phases and forming the differential signals. The detection circuit 60 detects a desired signal (an angular velocity signal, an acceleration signal, a velocity signal, or the like) based on the first detection signal IQ1 and the second detection signal IQ2. For example, the detection circuit 60 performs a process of extracting the desired signal while removing an unnecessary signal included in the first detection signal IQ1 and the second detection signal IQ2.

The detection circuit 60 includes a Q/V conversion circuit 62 (first charge/voltage conversion circuit) to which the first detection signal IQ1 is input and a Q/V conversion circuit 64 (second charge/voltage conversion circuit) to which the second detection signal IQ2 is input. The Q/V conversion circuits 62 and 64 (charge amplifiers) are circuits that convert charge signals (minute charge signals or minute current signals) from the physical quantity transducer 18 into voltage signals and can be considered to be each a kind of I/V conversion circuit. For example, the Q/V conversion circuit 62 converts the first detection signal IQ1 which is a minute charge signal into a first voltage signal and the Q/V conversion circuit 64 converts the second detection signal IQ2 which is a minute charge signal into a second voltage signal. The converted first and second voltage signals are differential signals having mutually reverse phases. The Q/V conversion circuits 62 and 64 each include, for example, an operational amplifier and a feedback capacitor. The Q/V conversion circuits 62 and 64 may each include a feedback resistor element.

The diagnosis circuit 150 is a circuit that perform diagnosis (self-diagnosis) on the detection circuit 60 (circuit device) in a diagnosis mode (during a diagnosis period). For example, the diagnosis circuit 150 performs an operation of generating a pseudo-desired signal (pseudo-angular velocity signal or the like) for diagnosing the detection circuit 60 and supplying the pseudo-desired signal to the detection circuit 60.

Specifically, in FIG. 1, the diagnosis circuit 150 includes a first capacitor C1 and a second capacitor C2. The first capacitor C1 is provided between a first node N1 and a first input node NA1 of the Q/V conversion circuit 62 to which the first detection signal IQ1 is input. The second capacitor C2 is provided between the first node N1 and a second input node NA2 of the Q/V conversion circuit 64 to which the second detection signal IQ2 is input. The first input node NA1 and the second input node NA2 are nodes on one-end sides of the first capacitor C1 and the second capacitor C2, and the first node N1 is a node on the other-end sides of the first capacitor C1 and the second capacitor C2.

A capacitance value of the second capacitor C2 is different from a capacitance value of the first capacitor C1. For example, when C is assumed to be the capacitance value of the first capacitor C1, the capacitance value of the second capacitor C2 is C+ΔC. Here, ΔC may be a positive capacitance value or may be a negative capacitance value. A ratio of ΔC (the absolute value of ΔC) to the capacitance value C can be set to, for example, about 5% to about 30%.

In FIG. 1, a diagnosis signal SFD is input to the first node N1 at the time of the diagnosis mode (diagnosis period). For example, after supply of power and before a normal operation period, the diagnosis signal SFD is supplied to the first node N1 and a diagnosis process (self-diagnosis) of the detection circuit 60 (the circuit device) is performed. The diagnosis signal SFD is, for example, a signal which is generated inside the circuit device, rather than a signal supplied from the outside of the circuit device. For example, as will be described below, the diagnosis signal SFD is a signal which is generated based on a signal from a driving circuit 30 of the physical quantity transducer 18. Specifically, the diagnosis signal SFD is a signal which has the same phase (including substantially the same) as a synchronization signal SYC (reference signal) output by the driving circuit 30.

In this way, when the diagnosis signal SFD is input to the first node N1 in the diagnosis mode, the Q/V conversion circuit 62 outputs a first voltage signal with a first voltage amplitude according to a first capacitance ratio of the first capacitor C1 to the feedback capacitor of the Q/V conversion circuit 62. The Q/V conversion circuit 64 outputs a second voltage signal with a second voltage amplitude according to a second capacitance ratio of the second capacitor C2 to the feedback capacitor of the Q/V conversion circuit 64. Since the capacitor values of the first capacitor C1 and the second capacitor C2 are different from each other, the first and second capacitance ratios are also different. Therefore, a voltage difference also occurs between the first voltage amplitude of the first voltage signal output by the Q/V conversion circuit 62 and the second voltage amplitude of the second voltage signal output by the Q/V conversion circuit 64. Accordingly, when a voltage difference between the first and second voltage amplitudes is subjected to differential amplification by a differential amplification circuit or the like on the rear stage, a desired signal for diagnosis which is a pseudo-desired signal can be supplied to the detection circuit 60 in the diagnosis mode. Then, diagnosis (self-diagnosis or fault diagnosis) regarding whether the detection circuit 60 normally operates can be performed based on a detection result of the detection circuit 60 obtained from the desired signal for diagnosis.

Figure 2:
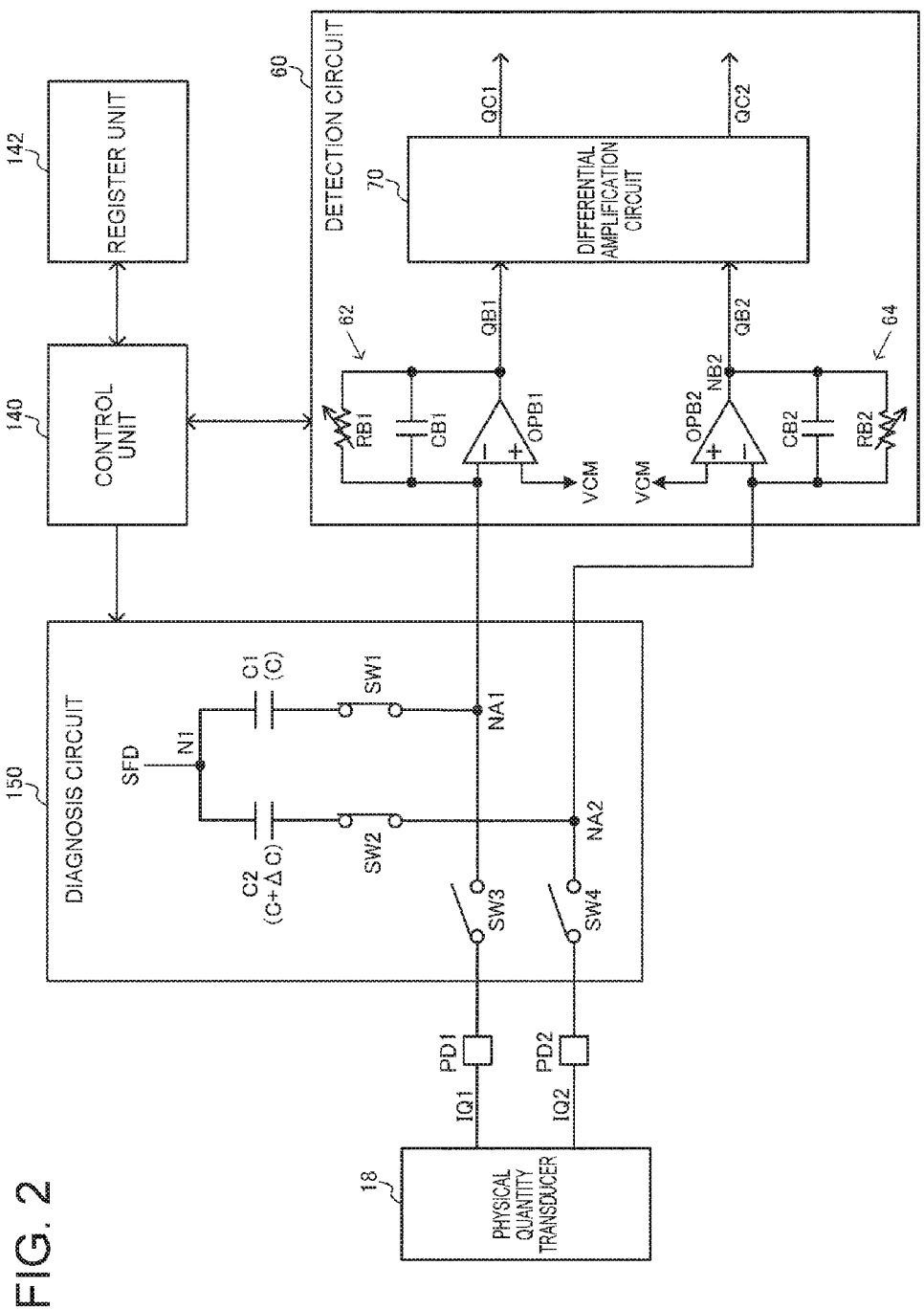
FIG. 2 is a diagram illustrating a detailed configuration example of the circuit device.

FIG. 2 is a diagram illustrating a detailed configuration example of the circuit device according to the embodiment. The circuit device according to the embodiment may not have the configuration in FIG. 2. According to various modification examples, some of the constituent elements can be omitted or other constituent elements can be added.

The circuit device includes a first terminal PD1 to which the first detection signal IQ1 is input and a second terminal PD2 to which the second detection signal IQ2 is input. The first terminal PD1 and the second terminal PD2 are, for example, pads of the circuit device (IC) and are provided in, for example, I/O regions of the circuit device.

A control unit 140 performs various control processes. For example, the control unit 140 performs a control process on the detection circuit 60 and a control process on the diagnosis circuit 150. The control unit 140 can be realized by, for example, a logic circuit generated in accordance with an automatic arranged wiring method, such as a gate array, or a processor operating based on firmware or the like.

A register unit 142 includes registers in which various kinds of information are set. The register unit 142 can be realized by, for example, a memory such as an SRAM, a flip flop circuit, and the like.

The diagnosis circuit 150 includes a first switch element SW1 and a second switch element SW2. The diagnosis circuit 150 can include a third switch element SW3 and a fourth switch element SW4. The first switch element SW1 to the fourth switch element SW4 can be configured to include, for example, MOS transistors (for example, NMOS type transistors or transfer gates).

The first switch element SW1 is provided between the first input node NA1 and one end of the first capacitor C1. The second switch element SW2 is provided between the second input node NA2 and one end of the second capacitor C2. The diagnosis signal SFD is supplied to the first node N1 on the other-end sides of the first capacitor C1 and the second capacitor C2. According to a modification example, circuit elements (resistor elements or the like) other than the first switch element SW1 and the second switch element SW2 can also be provided between the first capacitor C1 and the second capacitor C2, and the first input node NA1 and the second input node NA2.

The third switch element SW3 is provided between the first input node NA1 and the first terminal PD1 of the circuit device. The fourth switch element SW4 is provided between the second input node NA2 and the second terminal PD2 of the circuit device. According to a modification example, other circuit elements (resistor elements or the like) can also be provided between the first terminal PD1 and the second terminal PD2, and the third switch element SW3 and the fourth switch element SW4.

In the circuit device in FIG. 2, the first switch element SW1 and the second switch element SW2 are turned on and the third switch element SW3 and the fourth switch element SW4 are turned off in the diagnosis mode (the diagnosis period). Accordingly, the desired signal for diagnosis (pseudo-desired signal) using the diagnosis signal SFD can be supplied to the detection circuit 60 via the turned-on first switch element SW1 and second switch element SW2 while electric connection between the first terminal PD1 and the second terminal PD2 is blocked by the turned-off third switch element SW3 and fourth switch element SW4.

During a normal operation period, the first switch element SW1 and the second switch element SW2 are turned off and the third switch element SW3 and the fourth switch element SW4 are turned on. Here, the normal operation period is a period in which the detection circuit 60 performs a detection operation. That is, the normal operation period is a period in which the detection circuit 60 performs a detection process for a desired signal (an angular velocity signal, an acceleration signal, a velocity signal, or the like) using the first detection signal IQ1 and the second detection signal IQ2. In this way, during the normal operation period, it is possible to realize the detection process using the first detection signal IQ1 and the second detection signal IQ2 input via the turned-on third switch element SW3 and fourth switch element SW4 while electric connection between the first capacitor C1 and the second capacitor C2 is blocked by the turned-off first switch element SW1 and second switch element SW2.

More specifically, the first switch element SW1 and the second switch element SW2 are turned on after supply of power and before the normal operation period. That is, after the supply of power and before the normal operation period, for example, an operation mode of the circuit device is set to the diagnosis mode (an initial diagnosis mode or a self-diagnosis mode) by the control unit 140. Then, the first switch element SW1 and the second switch element SW2 are turned on and the third switch element SW3 and the fourth switch element SW4 are turned off, so that the diagnosis process of the detection circuit 60 using the diagnosis signal SFD is performed. After start of the normal operation period, the normal operation is temporarily stopped and the operation mode may be set to the diagnosis mode in the stop period. Then, the first switch element SW1 and the second switch element SW2 may be turned on and the diagnosis process may be performed.

The control unit 140 performs ON-OFF control such that the switch elements are turned on or off. For example, the control unit 140 performs the ON-OFF control for the first switch element SW1 and the second switch element SW2 or the third switch element SW3 and the fourth switch element SW4. For example, in the diagnosis mode, the control unit 140 performs control such that the first switch element SW1 and the second switch element SW2 are turned on and the third switch element SW3 and the fourth switch element SW4 are turned off. Specifically, after supply of power and before the normal operation period, the control is performed such that the first switch element SW1 and the second switch element SW2 are turned on and the third switch element SW3 and the fourth switch element SW4 are turned off. Further, during the normal operation period in which the detection circuit 60 performs the desired signal detection operation, the control unit 140 performs control such that the first switch element SW1 and the second switch element SW2 are turned off and the third switch element SW3 and the fourth switch element SW4 are turned on.

The detection circuit 60 includes the first Q/V conversion circuit 62, the second Q/V conversion circuit 64, and a differential amplification circuit 70. The detection circuit 60 is not limited to the configuration in FIG. 2. According to various modification examples, some of the constituent elements can be omitted or other constituent elements can be added.

The Q/V conversion circuit 62 includes an operational amplifier OPB1, a feedback capacitor CB1, and a feedback resistor element RB1. Anon-inversion input terminal of the operational amplifier OPB1 is set with an analog common voltage VCM (analog ground). The feedback capacitor CB1 is provided between an output terminal and an inversion input terminal of the operational amplifier OPB1. The feedback resistor element RB1 is also provided between the output terminal and the inversion input terminal of the operational amplifier OPB1. The feedback resistor element RB1 is an element which sets a DC bias point of an output signal of the operational amplifier OPB1 and the feedback resistor element RB1 may be configured to be omitted.

The Q/V conversion circuit 64 includes an operational amplifier OPB2, a feedback capacitor CB2, and a feedback resistor element RB2. Anon-inversion input terminal of the operational amplifier OPB2 is set with an analog common voltage VCM. The feedback capacitor CB2 is provided between an output terminal and an inversion input terminal of the operational amplifier OPB2. The feedback resistor element RB2 is also provided between the output terminal and the inversion input terminal of the operational amplifier OPB2. The feedback resistor element RB2 is an element which sets a DC bias point of an output signal of the operational amplifier OPB2 and the feedback resistor element RB2 may be configured to be omitted.

The Q/V conversion circuits 62 and 64 convert charge signals into voltage signals by accumulating charges of charge signals which are the detection signals IQ1 and IQ2 from the physical quantity transducer 18 in the feedback capacitors CB1 and CB2. The Q/V conversion circuits 62 and 64 have lowpass filter characteristics. For example, the capacitance values of the feedback capacitors CB1 and CB2 are set such that cut-off frequencies are sufficiently lower than a driving frequency (resonant frequency) of the physical quantity transducer 18.

The differential amplification circuit 70 is provided on the rear stage side of the Q/V conversion circuits 62 and 64. The differential amplification circuit 70 performs differential amplification on signals QB1 and QB2 output from the Q/V conversion circuits 62 and 64 and outputs signals QC1 and QC2. For example, the differential amplification circuit performs differential amplification to amplify differential components (difference) of the signals QB1 and QB2 and outputs the signals QC1 and QC2 which are differential signals. By performing such differential amplification, it is possible to remove an unnecessary signal with the same phase as the phase of the desired signal.

Figure 3:
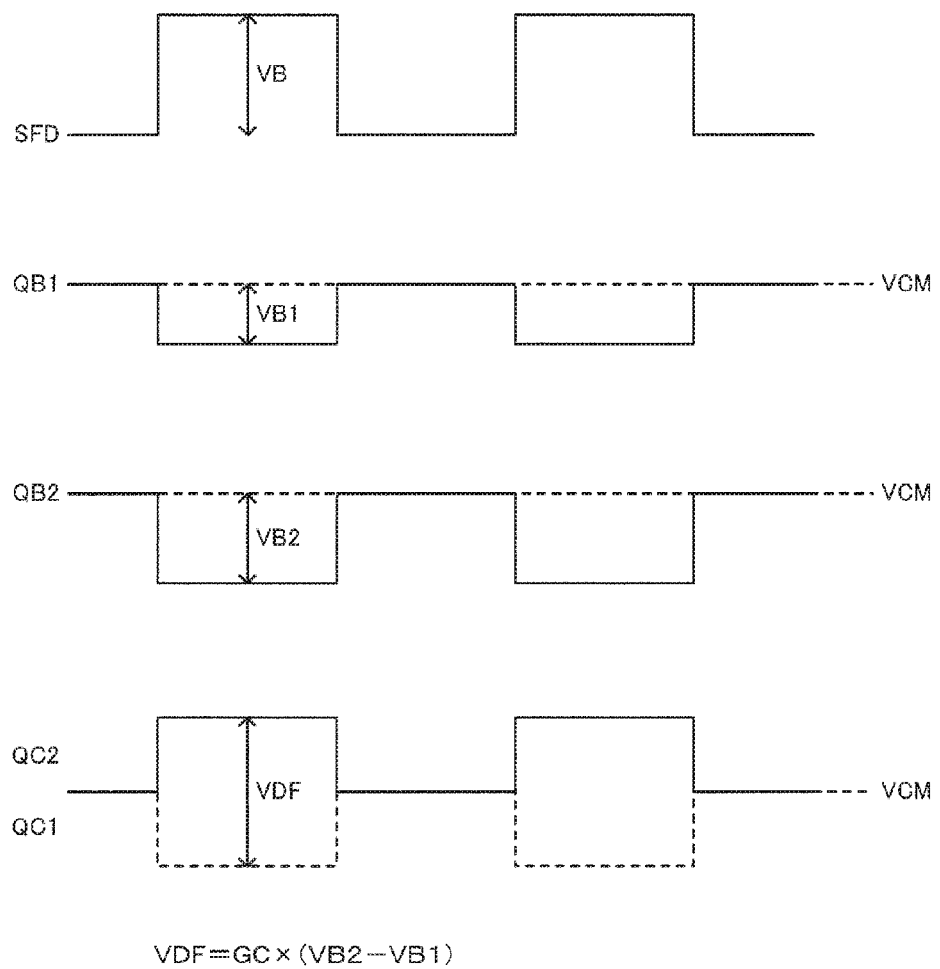
FIG. 3 is a diagram illustrating signal waveforms to describe an operation of the circuit device.

FIG. 3 is a diagram illustrating signal waveforms to describe an operation of the circuit device according to the embodiment. In FIG. 3, the diagnosis signal SFD of which a voltage amplitude is VB is input to the first node N1 in FIG. 2. Then, the Q/V conversion circuit 62 outputs the signal QB1 of which a voltage amplitude is VB1 and the Q/V conversion circuit 64 outputs the signal QB2 of which a voltage amplitude is VB2. In FIG. 3, the diagnosis signal SFD has a rectangular wave, but may be a periodic signal such as a sinusoidal wave.

For example, the capacitance values of the feedback capacitors CB1 and CB2 are the same as each other and the capacitance value of the capacitor C2 is greater than the capacitance value of the capacitor C1. The capacitance values of the capacitors CB1 and CB2 are, for example, about 0.5 pF to about 1.5 pF. The capacitance value C of the capacitor C1 is, for example, in the range of about 250 fF to about 750 fF. The difference ΔC between the capacitance values of the capacitors C1 and C2 is, for example, in the range of about 50 fF to about 150 fF. C1, C2, CB1, and CB2 can be realized by, for example, capacitors formed of polysilicon (poly two-layered capacitors) or capacitors formed of metal-insulator-metal (MIM).

In this way, when the capacitance value of the capacitor C2 is greater than that of the capacitor C1, as illustrated in FIG. 3, the Q/V conversion circuits 62 and 64 output the signals QB1 and QB2 in which a relation of VB1<VB2 is established. Specifically, the Q/V conversion circuits 62 and 64 are inversion amplifiers. Accordingly, as illustrated in FIG. 3, when the diagnosis signal SFD has a positive polarity, the Q/V conversion circuits 62 and 64 output the signals QB1 and QB2 which has a negative polarity using an analog common voltage VCM as a reference (center) and in which the relation of VB1<VB2 is established in the voltage amplitude.

That is, both of the potentials of the input nodes NA1 and the NA2 are set to the analog common voltage VCM by virtual ground (virtual short) by the operational amplifiers OPB1 and OPB2 of the Q/V conversion circuits 62 and 64. The capacitance value of the capacitor C2 is greater than that of the capacitor C1. Therefore, when the diagnosis signal SFD of which a voltage amplitude is VB is applied to the other ends of the capacitors C1 and C2, the amount of accumulated charge of the capacitor C2 is greater than the amount of accumulated charge of the capacitor C1. Since the capacitance values of the feedback capacitors CB1 and CB2 of the Q/V conversion circuits 62 and 64 are the same as each other, the relation of VB1<VB2 is established in the voltage amplitudes of the signals QB1 and QB2. That is, the voltage amplitude VB1 of the signal QB1 is set to an amplitude according to a capacitance ratio (C1/CB1) of the capacitor C1 to the feedback capacitor CB1. The voltage amplitude VB2 of the signal QB2 is set to an amplitude according to a capacitance ratio (C2/CB2) of the capacitor C2 to the feedback capacitor CB2. Since the capacitance value of the capacitor C2 is greater than that of the capacitor C1, the relation of VB1<VB2 is established.

The differential amplification circuit 70 amplifies the differential components of the signals QB1 and QB2. Accordingly, as illustrated in FIG. 3, signals of which a difference between the signals QB1 and QB2 is multiplied by a gain and is inverted are output as differential signals QC1 and QC2. For example, when GC is assumed to be the gain of the differential amplification of the differential amplification circuit 70, a difference voltage between the signals QC1 and QC2 can be expressed as VDF=GC×(VB2−VB1).

In this way, by inputting the diagnosis signal SFD to the node N1 on the other end side of the capacitor C1, the desired signal for diagnosis (pseudo-desired signal) indicated in the signals QC1 and QC2 can be supplied to the detection circuit 60. Then, the detection circuit 60 performs an operation of detecting the desired signal for diagnosis and monitors the detection result so that diagnosis (self-diagnosis or fault diagnosis) regarding whether the detection circuit 60 normally operates can be performed. Specifically, by detecting a difference voltage VDF between the signals QC1 and QC2 in FIG. 3, it is possible to diagnose the detection circuit 60.

For example, since the capacitance values of the capacitors C1, C2, CB1, and CB2 or the voltage amplitude of the diagnosis signal SFD are known, the difference voltage VDF between the signals QC1 and QC2 is also known. Accordingly, when the detection result of the detection circuit 60 corresponding to the difference voltage VDF is within a range of an expected value, the detection circuit 60 can be diagnosed as normally operating. Specifically, for example, a synchronization detection circuit 81 to be described below performs synchronization detection to detect the desired signals (QC1 and QC2) for diagnosis while removing unnecessary signals. That is, by performing the synchronization detection, the desired signals for diagnosis having the same phase as a synchronization signal are extracted while removing an unnecessary signal with a different phase from the synchronization signal (for example, an unnecessary signal of which a phase is deviated by 90 degrees). That is, components of the desired signals for diagnosis are shown in a frequency band such as a DC in a frequency spectrum. Accordingly, when the value of a DC component of the desired signals for diagnosis (a DC voltage value or an A/D conversion value of the DC voltage) is within a range of an expected value, the detection circuit 60 can be diagnosed as normally operating.

Figure 4:
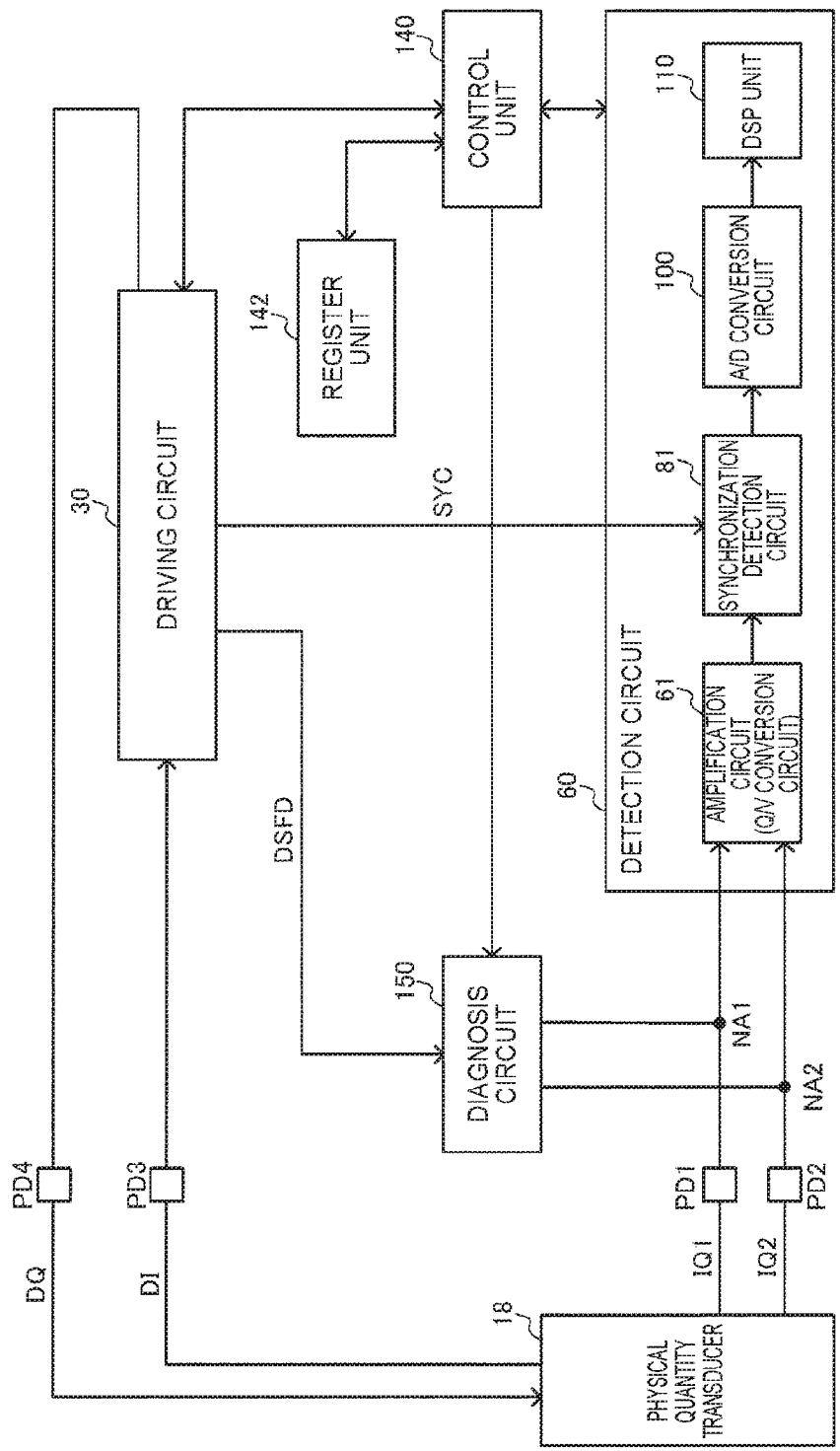
FIG. 4 is a diagram illustrating an overall system configuration example of the circuit device.

FIG. 4 is a diagram illustrating an overall system configuration of the circuit device according to the embodiment. The circuit device in FIG. 4 further includes the driving circuit 30 in addition to the configuration of the detection circuit 60, the control unit 140, the register unit 142, and the diagnosis circuit 150.

The driving circuit 30 drives the physical quantity transducer 18. For example, the driving circuit 30 drives the physical quantity transducer 18, for example, by receiving a feedback signal DI from the physical quantity transducer 18 and outputting a driving signal DQ corresponding to the feedback signal DI. For example, the first detection signal IQ1 and the second detection signal IQ2 from the physical quantity transducer 18 are input to the detection circuit 60 of the circuit device via the terminals PD1 and PD2 (pads). The feedback signal DI from the physical quantity transducer 18 is input to the driving circuit 30 of the circuit device via a terminal PD3 (pad), and the driving circuit 30 outputs the driving signal DQ to the physical quantity transducer 18 via a terminal PD4 (pad).

The detection circuit 60 includes an amplification circuit 61 including the Q/V conversion circuits 62 and 64 or the differential amplification circuit 70, the synchronization detection circuit 81, the A/D conversion circuit 100, and a DSP unit 110 (digital signal processing unit). The details of the circuits will be described below. The detection circuit 60 is not limited to the configuration in FIG. 4. According to various modification examples, some of the constituent elements can be omitted or other constituent elements can be added. For example, a type of the detection circuit 60 outputting an analog detection result may be realized without providing the A/D conversion circuit 100 or the DSP unit 110.

In FIG. 4, the synchronization detection circuit 81 performs synchronization detection based on a synchronization signal SYC from the driving circuit 30. That is, the synchronization detection circuit 81 performs the synchronization detection on an output signal of the amplification circuit 61 based on the synchronization signal SYC and performs the synchronization detection to extract a desired signal while removing an unnecessary signal. Then, the signal SFD based on a signal DSFD from the driving circuit 30 is input to the node N1 on the other-end sides of the capacitors C1 and C2 of the diagnosis circuit 150. For example, the signal SFD in FIG. 2 is the signal DSFD itself from the driving circuit 30 or a signal in which the voltage level of the signal DSFD is changed.

Specifically, the driving circuit 30 supplies the signal DSFD having the same phase (including substantially the same) as the synchronization signal SYC to the diagnosis circuit 150. For example, the diagnosis signal SFD and the synchronization signal SYC in FIG. 3 are signals having the same phase and the same frequency. When the signals QC1 and QC2 (or signals obtained by amplifying the signals QC1 and QC2 by a gain) are subjected to the synchronization detection using the synchronization signal SYC having the same phase as the diagnosis signal SFD, a detection result (DC voltage) corresponding to the difference voltage VDF can be obtained. Then, the detection result can be compared to an expected value, that is, the detection circuit 60 can be diagnosed.

Figure 5:
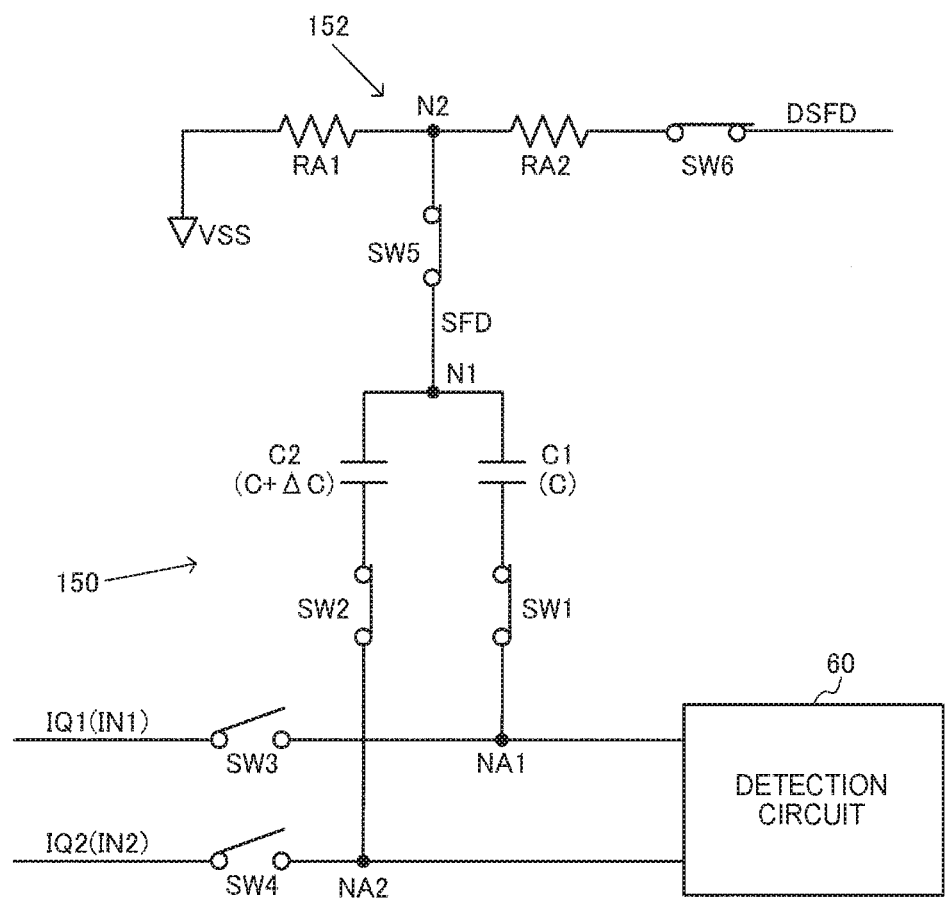
FIG. 5 is a diagram illustrating a detailed configuration example of a diagnosis circuit.

FIG. 5 is a diagram illustrating a detailed configuration example of the diagnosis circuit 150. In FIG. 5, switch elements SW5 and SW6 and resistor elements RA1 and RA2 are further provided in addition to the configuration in FIG. 2. The signal DSFD from the driving circuit 30 is input to one end of the switch element SW6, as illustrated in FIG. 4. The signal DSFD is a signal that has the same phase as the synchronization signal SYC and is a signal that has, for example, rectangular wave.

The resistor elements RA1 and RA2 connected in series are provided between the other end of the switch element SW6 and a VSS (GND). The resistor elements RA1 and RA2 convert a voltage level of the signal DSFD which is a signal from the driving circuit 30. That is, the voltage level of the signal DSFD is subjected to voltage division according to a voltage division ratio (RA1/(RA1+RA2)) decided by resistant values of the resistor elements RA1 and RA2 and a signal after the voltage division is generated in a connection node N2 of the resistor elements RA1 and RA2. The connection node N2 is connected to the node N1 via the switch element SW5. For example, the voltage level of the signal DSFD is subjected to the voltage division by, for example, about ½ to about ⅛ (preferably, about ¼) by the resistor elements RA1 and RA2 to generate the signal SFD. The signal DSFD is a voltage signal of which a voltage amplitude is, for example, about 2.0 V to about 2.8 V. The synchronization signal SYC is a voltage signal with, for example, about 2.9 V to about 3.7 V.

In the diagnosis mode, the switch elements SW3 and SW4 are turned off and the switch elements SW1, SW2, SW5, and SW6 are turned on. Accordingly, the signal obtained by converting the voltage level of the signal DSFD from the driving circuit 30 (for example, the signal subjected to the voltage division by about ½ to about ⅛) is input as the diagnosis signal SFD to the node N1 of the other ends of the capacitors C1 and C2.

As illustrated in FIG. 4, the detection circuit 60 includes the amplification circuit 61 and circuits (a Q/V conversion circuit, a differential amplification circuit, and the like) of the amplification circuit 61 is configured to include an operational amplifier. Therefore, when the signal DSFD from the driving circuit 30 is input to the node N1 of the other ends of the capacitors C1 and C2 without change, there is a concern of an operation of the operational amplifier being saturated. That is, the operational amplifier may operate in a saturation region in which an output voltage of the operational amplifier reaches the vicinity of a power supply voltage.

From this viewpoint, in FIG. 5, by converting the voltage level of the signal DSFD using the resistor elements RA1 and RA2 (a voltage division circuit in a broad sense) of the diagnosis circuit, it is possible to reduce the voltage amplitude of the diagnosis signal SFD input to the node N1 of the other ends of the capacitors C1 and C2. Accordingly, it is possible to resolve a situation in which the operational amplifier operates in the saturation region, as described above. In FIG. 5, the voltage level of the signal DSFD is converted according to the voltage division method using the resistor elements RA1 and RA2. However, the voltage level conversion method according to the embodiment is not limited thereto, but various modification examples can be realized.

Figure 6:
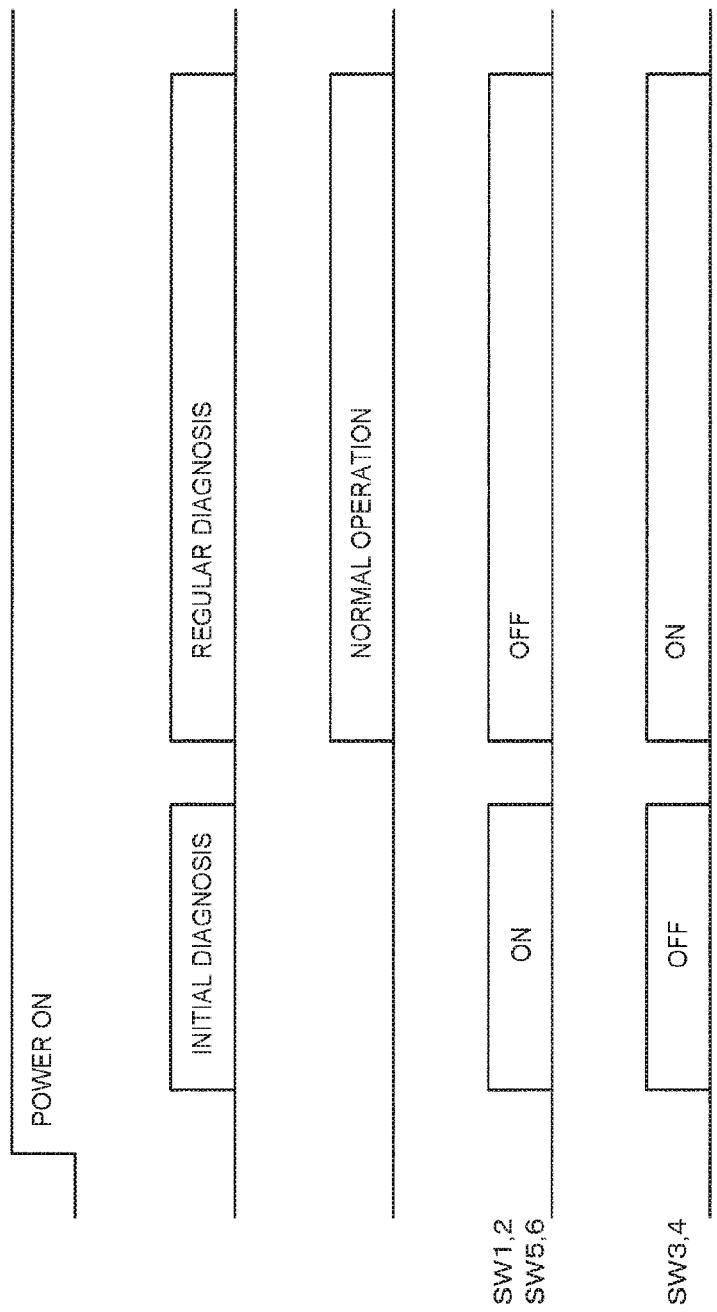
FIG. 6 is a diagram illustrating an operation sequence to describe an operation of the circuit device.

FIG. 6 is a diagram illustrating an operation sequence to describe an operation of the circuit device according to the embodiment. As illustrated in FIG. 6, after power is supplied to the circuit device and the power is turned on, the circuit device is set to the diagnosis mode to perform initial diagnosis. That is, diagnosis is performed to verify whether the detection circuit 60 normally operates. At the time of the initial diagnosis (diagnosis mode), the switch elements SW1, SW2, SW5, and SW6 of the diagnosis circuit 150 are turned on while the switch elements SW3 and SW4 are turned off. Accordingly, inputting the detection signals IQ1 and IQ2 from the physical quantity transducer 18 is electrically blocked and the signal obtained by converting the voltage level of the signal DSFD from the driving circuit 30 is input as the diagnosis signal SFD to the node N1 of the other ends of the capacitors C1 and C2. Accordingly, as described in FIG. 3, the pseudo-desired signal for diagnosis is supplied to the detection circuit 60, and thus it is possible to diagnose whether each circuit of the detection circuit 60 normally operates.

On the other hand, when the initial diagnosis ends and the normal operation period in which the desired signal is detected comes, the switch elements SW3 and SW4 are turned on while the switch elements SW1, SW2, SW5, and SW6 are turned off. Accordingly, the detection signals IQ1 and IQ2 from the physical quantity transducer 18 are input to the detection circuit 60 to perform a process of detecting the desired signal. At this time, by turning off the switch elements SW1 and SW2, it is possible to suppress a situation in which, for example, noise based on the signal DSFD from the driving circuit 30 is delivered to the input nodes NA1 and NA2 of the detection circuit 60.

In this way, in FIG. 6, after supply of power and before the normal operation period, the diagnosis mode is set. The setting of the diagnosis mode is realized, for example, when an external controller or the like of the circuit device issues a command to start the diagnosis mode (initial diagnosis) and the command is received via an interface of the circuit device. Alternatively, after supply of power, the operation mode of the circuit device may be automatically set to the diagnosis mode.

As illustrated in FIG. 6, by turning on the switch elements SW1, SW2, SW5, and SW6 during the period of the initial diagnosis and inputting the signal SFD to the node N1 of the other ends of the capacitors C1 and C2, it is possible to realize the self-diagnosis of the detection circuit 60. On the other hand, when the normal operation period enters, the switch elements SW1, SW2, SW5, and SW6 are turned off, and the switch elements SW3 and SW4 are turned on. Accordingly, the detection signals IQ1 and IQ2 from the physical quantity transducer 18 are input, and thus the detection circuit 60 can perform the operation of detecting the desired signal. Even during the normal operation period, as will be described below, regular diagnosis is performed to regularly confirm whether the detection circuit 60 normally operates.

In FIG. 6, the case in which the diagnosis mode is set after the supply of the power and before the normal operation period has been described, but the embodiment is not limited thereto. For example, after the normal operation starts, the normal operation is temporarily stopped and the diagnosis process for the circuit device may be performed, for example, based on issuing of the command from the external controller of the circuit device. After the diagnosis process ends, the normal operation may resume.

Figure 7A:
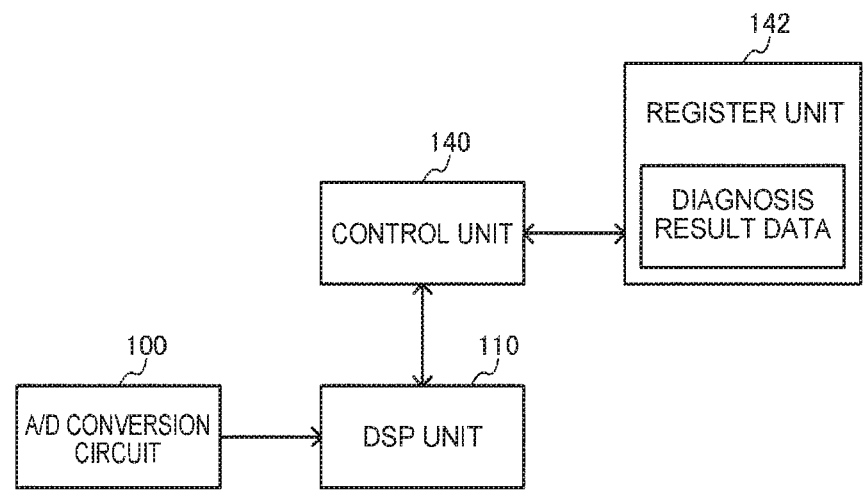
FIGS. 7A and 7B are diagrams illustrating a method of outputting a detection result in a diagnosis mode.
Figure 7B:
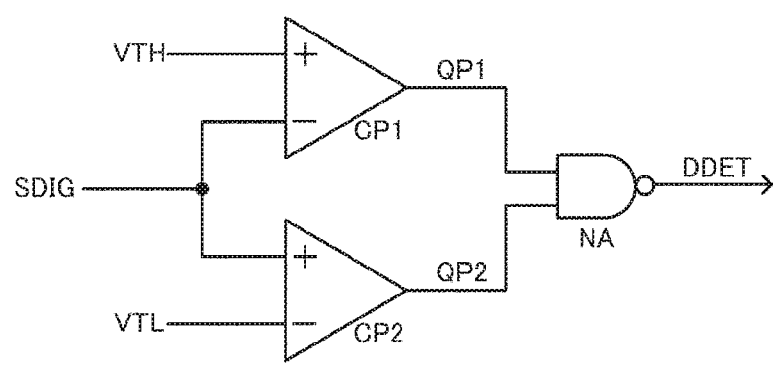

FIGS. 7A and 7B are diagrams illustrating a method of outputting a detection result in the diagnosis mode. In the embodiment, the circuit device outputs a detection result of the detection circuit 60 in the diagnosis mode and delivers the detection result to the external controller or the like.

For example, in FIG. 7A, the detection result of the desired signal for diagnosis described in FIG. 3 is subjected to A/D conversion to be output as the detection result in the diagnosis mode.

Specifically, the circuit device includes the register unit 142 to output the detection result. The external controller or the like can access the register unit 142 via the interface of the circuit device. The detection circuit 60 includes the A/D conversion circuit 100 that performs A/D conversion on a detection result signal in the detection circuit 60. The detection result signal is, for example, a detection signal of the desired signal obtained through the synchronization detection of the synchronization detection circuit 81 in FIG. 4.

Then, in the register unit 142, diagnosis result data obtained by performing the A/D conversion on the detection result in the diagnosis mode is set as the detection result. For example, the detection signal obtained through the synchronization detection of the desired signal for diagnosis (the pseudo-desired signal) is subjected to the A/D conversion by the A/D conversion circuit 100. Then, digital signal processing (filter processing, a correction process, or the like) is performed on an A/D conversion value by the DSP unit 110. The diagnosis result data obtained in this way is set in the register unit 142. The external controller or the like accesses the register unit 142 to read the diagnosis result data, so that the detection result in the detection circuit in the diagnosis mode is output to the outside. The diagnosis result data set in the register unit 142 may be the A/D conversion value of the detection signal in the diagnosis mode. Alternatively, the control unit 140 may determine whether the A/D conversion value of the detection signal is within the range of the expected value and the determination result may be set as the diagnosis result data in the register unit 142.

Various methods can be assumed as the method of outputting the detection result in the diagnosis mode. For example, FIG. 7B illustrates an example of a method of outputting the detection result using an analog circuit.

In FIG. 7B, a detection signal SDIG of the desired signal for diagnosis is input to an inversion input terminal of a comparator CP1 and a non-inversion input terminal of a comparator CP2. A threshold voltage VTH on a high potential side is input to the non-inversion input terminal of the comparator CP1 and a threshold voltage VTL on a low potential side is input to the inversion input terminal of the comparator CP2. Here, a relation of VTH>VTL is established. Then, an output signal of the comparator CP1 and an output signal of the comparator CP2 are input to a NAND circuit NA, and then a detection result signal DDET is output.

By using the circuit in FIG. 7B, it is possible to determine whether the voltage level of the detection signal SDIG of the desired signal for diagnosis is within a voltage range between the threshold voltages VTH and VTL (within a voltage range of an expected value).

For example, when the voltage level of the detection signal SDIG is within the voltage range between the threshold voltages VTH and VTL, the detection result signal DDET is at a low level and it is determined that the detection circuit 60 normally operates.

Conversely, when the voltage level of the detection signal SDIG is out of the voltage range between the threshold voltages VTH and VTL, the detection result signal DDET is at a high level and it is determined that the detection circuit 60 does not normally operate. That is, a fault is determined to occur.

The detection result signal DDET is output as the detection result in the diagnosis mode from a terminal of the circuit device and the external controller or the like can determine whether the detection circuit 60 of the circuit device normally operates by monitoring the detection result signal DDET. The determination process as in FIG. 7B may not be performed and an analog DC voltage (voltage of SDIG) may be output as the detection result without change.

In the circuit device described above according to the embodiment, the diagnosis circuit 150 including the capacitors C1 and C2 with different capacitance values is provided and the diagnosis signal SFD is input to the node N1 on the other-end side of the capacitors C1 and C2 in the diagnosis mode so that the pseudo-desired signal for diagnosis is supplied to the detection circuit 60. Then, by monitoring the detection result of the detection circuit 60 in the diagnosis mode, it is determined whether the detection circuit 60 normally operates. In this way, it is possible to diagnose the detection circuit 60 when the circuit device actually operates after the supply of the power, so that reliability is improved.

For example, in the method of the technology of the related art, as described above, the performance of the detection circuit 60 at the time of manufacturing or before the manufacturing can be evaluated, but the diagnosis (self-diagnosis) of the detection circuit 60 may not be performed at the time of actual operation of the circuit device. That is, in the method of the technology of the related art, when the circuit device is embedded in a product such as an electronic apparatus or a moving object, the diagnosis process of the detection circuit 60 may not be realized. For this reason, when the circuit device is embedded in a product and a fault occurs while an actual operation continues or when the performance deteriorates, the fault may not be handled.

In the method according to the embodiment, however, it is possible to realize diagnosis of the detection circuit 60 at the time of an actual operation of the circuit device after the supply of the power, and thus it is possible to realize the diagnosis process when the circuit device is embedded in a product. Accordingly, when the circuit device is embedded in a product and a fault occurs while an actual operation continues or performance deteriorates, the fault or the performance deterioration can be detected in the diagnosis mode and can be reported to the external controller or the like. Accordingly, the reliability or the like can be considerably improved compared to the method of the technology of the related art.

In the embodiment, as illustrated in FIG. 6, whenever the power is supplied to the circuit device, the self-diagnosis is performed using the diagnosis circuit 150 during the initial diagnosis period. Accordingly, for example, the reliability against a fault or performance deterioration over time can be further improved compared to a method of performing diagnosis only once at the time of manufacturing.

In the embodiment, the desired signal for diagnosis is generated by noticing that the Q/V conversion circuits 62 and 64 include the feedback capacitors CB1 and CB2 and providing the capacitors C1 and C2 with different capacitance values in the diagnosis circuit 150 to use the capacitance ratio between the capacitors. In this way, the desired signal for diagnosis can be generated by effectively utilizing the presence of the feedback capacitors CB1 and CB2, and thus it is possible to realize the diagnosis of the detection circuit 60 using the diagnosis circuit 150 with a simple configuration.

In the embodiment, as illustrated in FIG. 2, the switch elements SW3 and SW4 are provided in the signal paths of the detection signals IQ1 and IQ2. For example, as pointed out in the technology of the related art described above, it is not desirable to interpose other circuit elements along the signal paths of the detection signals IQ1 and IQ2 since there is a concern that the detection performance of the circuit device deteriorates at the time of an actual operation.

From this viewpoint, for example, the switch elements SW3 and SW4 are provided between the terminals PD1 and PD2 and the input nodes NA1 and NA2 by much considering the reliability strongly necessary in, for example, a circuit device for a vehicle. In this way, in the diagnosis mode, the desired signal for diagnosis can be supplied to the detection circuit 60 via the turned-on switch elements SW1 and SW2 while turning off the switch elements SW3 and SW4 to block the electric connection with the side of the physical quantity transducer 18. In the normal operation mode, it is possible to detect the desired signal in the normal operation by turning on the switch elements SW3 and SW4 and inputting the detection signals IQ1 and IQ2 from the physical quantity transducer 18 to the detection circuit 60.

In the embodiment, the diagnosis signal SFD to be input to the other ends of the capacitors C1 and C2 are generated based on the signal from the driving circuit 30. Therefore, the self-diagnosis of the detection circuit 60 can be performed autonomously without inputting a diagnosis signal from the outside. In the diagnosis mode, by inputting the diagnosis signal SFD to the other ends of the capacitors C1 and C2, the desired signal for diagnosis is generated. Therefore, the process in the diagnosis mode can be simplified. In particular, when the signal DSFD with the same phase as the synchronization signal SYC is used as the signal from the driving circuit 30, the desired signal for diagnosis which can be detected without being removed by the synchronization detection can be generated, and thus it is possible to realize the optimum diagnosis process for the detection circuit 60 including the synchronization detection circuit 81.

2. Detailed Configurations of Electronic Apparatus, Gyro Sensor, and Circuit Device FIG. 8 is a diagram illustrating detailed configuration examples of the circuit device 20, a gyro sensor 510 (a physical quantity detection device in a broad sense) including the circuit device 20, and an electronic apparatus 500 including the gyro sensor 510 according to the embodiment.

Figure 8:
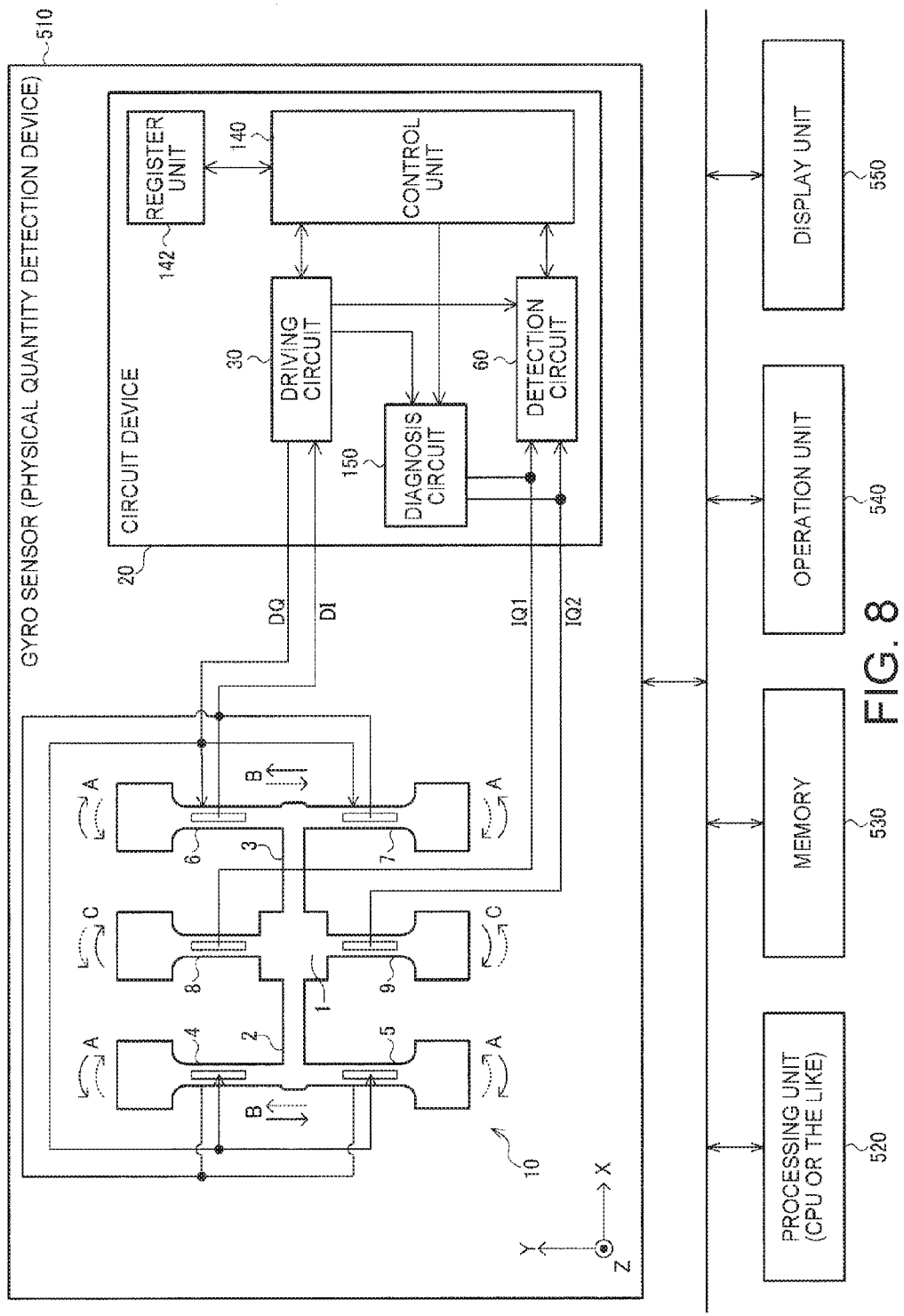
FIG. 8 is a diagram illustrating configuration examples of a circuit device, an electronic device, and a gyro sensor (physical quantity detection device) according to the embodiment.

The circuit device 20, the electronic apparatus 500, and the gyro sensor 510 are not limited to the configurations in FIG. 8. According to various modification examples, some of the constituent elements may be omitted or other constituent elements may be added. As the electronic apparatus 500 according to the embodiment, any of the various apparatuses such as a digital camera, a video camera, a smartphone, a mobile phone, a car navigation system, a robot, a biological information detection apparatus, a game apparatus, a watch, a health tool, and a portable information terminal can be assumed. Hereinafter, a case in which the physical quantity transducer is a piezoelectric vibration piece (vibration gyro) and a sensor is a gyro sensor will be exemplified in the description, but the invention is not limited thereto. For example, the invention can also be applied to an electrostatic capacitance detection type vibration gyro formed on a silicon substrate or the like or a physical quantity transducer which detects a physical quantity equivalent to angular velocity information or a physical amount other than angular velocity information.

The electronic apparatus 500 includes the gyro sensor 510 and a processing unit 520. The electronic apparatus 500 can include a memory 530, an operation unit 540, and a display unit 550. The processing unit 520 (controller) realized by a CPU, an MPU, or the like controls the gyro sensor 510 or the like or controls the entire electronic apparatus 500. The processing unit 520 performs a process based on angular velocity information (a physical quantity in a broad sense) detected by the gyro sensor 510. For example, the processing unit 520 performs a process for camera shake correction, posture control, GPS autonomous navigation, or the like based on the angular velocity information. The memory 530 (a ROM, a RAM, or the like) stores a control program or various kinds of data or functions as a work area or a data storage region. The operation unit 540 is used for a user to operate the electronic apparatus 500 and the display unit 550 displays various kinds of information for the user.

The gyro sensor 510 (physical quantity detection device) includes a vibration piece 10 and the circuit device 20. The vibration piece 10 (a physical quantity transducer in a broad sense) is a piezoelectric vibration piece formed of a thin plate of a piezoelectric material such as crystal. Specifically, the vibration piece 10 is a double-T shaped vibration piece formed by a Z cut crystal substrate.

The circuit device 20 includes the driving circuit 30, the detection circuit 60, the control unit 140, the register unit 142, and the diagnosis circuit 150. According to various modification examples, some of the constituent elements can be omitted or other constituent elements can be added.

The driving circuit 30 outputs a driving signal DQ to drive the vibration piece 10. For example, by receiving a feedback signal DI from the vibration piece 10 and outputting the driving signal DQ corresponding to the feedback signal DI, the vibration piece 10 is excited. The detection circuit 60 receives the detection signals IQ1 and IQ2 (detection currents or charges) from the vibration piece 10 driven by the driving signal DQ and detects (extracts) a desired signal (Coriolis force signal) according to the physical quantity applied to the vibration piece 10 from the detection signals IQ1 and IQ2.

The vibration piece 10 includes a base unit 1, connection arms 2 and 3, driving arms 4, 5, 6, and 7, and detection arms 8 and 9. The detection arms 8 and 9 extend from the rectangular base unit 1 in the +Y axis direction and the −Y axis direction. The connection arms 2 and 3 extend from the base unit 1 in the −X axis direction and the +X axis direction. The driving arms 4 and 5 extend from the connection arm 2 in the +Y axis direction and the −Y axis direction and the driving arms 6 and 7 extend from the connection arm 3 in the +Y axis direction and the −Y axis direction. The X, Y, and Z axes represent the axes of a crystal and are also referred to as an electric axis, a mechanical axis, and an optical axis, respectively.

The driving signal DQ from the driving circuit 30 is input to driving electrodes formed on the upper surface of the driving arms 4 and 5 and driving electrodes formed on the side surfaces of the driving arms 6 and 7. Signals from driving electrodes formed on the side surfaces of the driving arms 4 and 5 and driving electrodes formed on the upper surface of the driving arms 6 and 7 are input as the feedback signal DI to the driving circuit 30. Signals from detection electrodes formed on the upper surfaces of the detection arms 8 and 9 are input as the detection signals IQ1 and IQ2 to the detection circuit 60. Common electrodes formed on the side surfaces of the detection arms 8 and 9 are grounded, for example.

When the alternating-current driving signal DQ is applied by the driving circuit 30, the driving arms 4, 5, 6, and 7 perform bending vibration (excitation vibration), as indicated by arrows A by an inverse piezoelectric effect. That is, the driving arms 4, 5, 6, and 7 perform the bending vibration so that the front ends of the driving arms 4 and 6 repeatedly approach and are separated each other and the front ends of the driving arms 5 and 7 repeatedly approach and are separated each other. At this time, since the driving arms 4 and 5 and the driving arms 6 and 7 perform vibration of line symmetry with respect to the Y axis passing through the central position of the base unit 1, the base unit 1, the connection arms 2 and 3, and the detection arms 8 and 9 rarely vibrate.

In this state, when an angular velocity is applied to the vibration piece 10 using the Z axis as a rotation axis (when the vibration piece 10 is rotated about the Z axis), the driving arms 4, 5, 6, and 7 vibrate by the Coriolis force, as indicated by arrows B. That is, the Coriolis force in the direction of the arrows B perpendicular to the direction of the arrows A and the direction of the Z axis work on the driving arms 4, 5, 6, and 7, and thus vibration components in the direction of the arrows B occur. The vibration indicated by the arrows B is delivered to the base unit 1 via the connection arms 2 and 3, and thus the detection arms 8 and 9 perform the bending vibration in the direction of the arrows C. Charge signals generated by the piezoelectric effect by the bending vibration of the detection arms 8 and 9 are input as the detection signals IQ1 and IQ2 to the detection circuit 60. Here, the vibration of the driving arms 4, 5, 6, and 7 indicated by the arrows B is vibration in the circumferential direction of the central position of the base unit 1, and the vibration of the detection arms 8 and 9 is vibration in the direction of the arrows C opposite to the direction of the arrows B in the circumferential direction. Therefore, the detection signals IQ1 and IQ2 are signals of which phases are deviated from the driving signal DQ by 90 degrees.

For example, when ω is an angular velocity of the vibration piece 10 (gyro sensor) about the Z axis, m is a mass, and v is a vibration velocity, the Coriolis force is expressed as Fc=2m·v·ω. Accordingly, the detection circuit 60 can obtain the angular velocity ω by detecting the desired signal which is a signal according to the Coriolis force. Then, the processing unit 520 can perform various processes for camera shake correction, posture control, and GPS autonomous navigation using the obtained angular velocity ω.

In FIG. 8, the case in which the vibration piece 10 has the double T shape has been described, but the vibration piece 10 according to the embodiment is not limited to such a structure. For example, the vibration piece 10 may have a tuning fork form, an H form, or the like. A piezoelectric material of the vibration piece 10 may be a material such as ceramics or silicon other than crystal.

Figure 9:
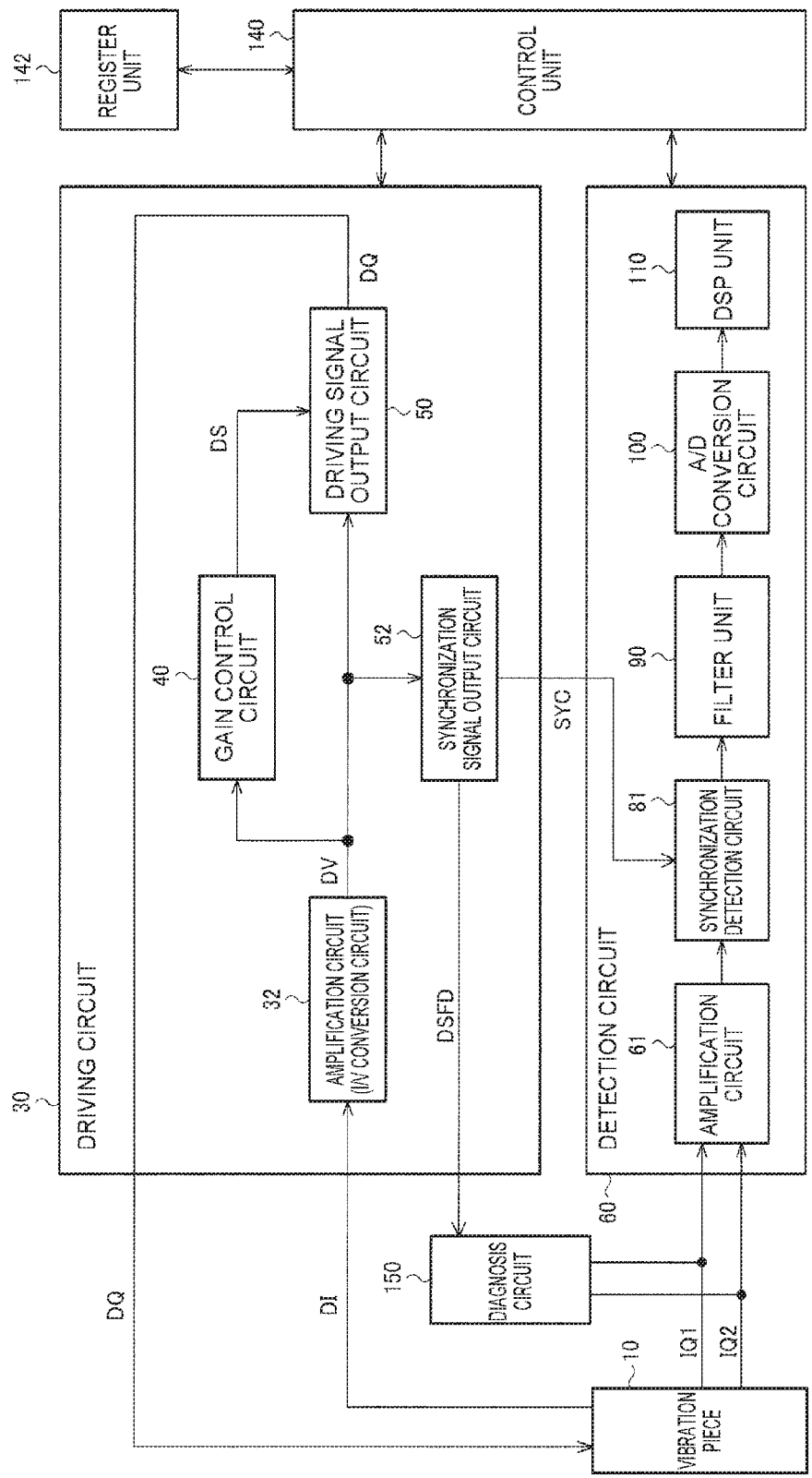
FIG. 9 is a diagram illustrating detailed configuration examples of the driving circuit and a detection circuit.

FIG. 9 is a diagram illustrating detailed configuration examples of the driving circuit 30 and the detection circuit 60 of the circuit device.

The driving circuit 30 includes an amplification circuit 32 to which the feedback signal DI from the vibration piece 10 is input, a gain control circuit 40 which perform automatic gain control, and a driving signal output circuit 50 which outputs the driving signal DQ to the vibration piece 10. The driving circuit 30 further includes a synchronization signal output circuit 52 which outputs the synchronization signal SYC to the detection circuit 60. The configuration of the driving circuit 30 is not limited to FIG. 9. According to various modification examples, some of the constituent elements can be omitted or other constituent elements can be added.

The amplification circuit 32 (I/V conversion circuit) amplifies the feedback signal DI from the vibration piece 10. For example, the current signal DI from the vibration piece 10 is converted into a voltage signal DV to be output. The amplification circuit 32 can be realized by an operational amplifier, a feedback resistor element, a feedback capacitor, and the like.

The driving signal output circuit 50 outputs the driving signal DQ based on the signal DV amplified by the amplification circuit 32. For example, when the driving signal output circuit 50 outputs the rectangular wave (or sinusoidal wave) driving signal, the driving signal output circuit 50 can be realized by a comparator or the like.

The gain control circuit 40 (AGC) outputs the control voltage DS to the driving signal output circuit 50 to control the amplitude of the driving signal DQ. Specifically, the gain control circuit 40 monitors the signal DV to control the gain of oscillation loop. For example, in the driving circuit 30, it is necessary to constantly maintain the amplitude of the driving voltage supplied to the vibration piece 10 (driving vibration piece) in order to constantly maintain sensitivity of the gyro sensor. Therefore, the gain control circuit 40 which automatically adjusts the gain is provided in the oscillation loop of a driving vibration system. The gain control circuit 40 automatically adjust a gain in a variable manner so that the amplitude (a vibration speed v of the vibration piece) of the feedback signal DI from the vibration piece 10 is constant. The gain control circuit 40 can be realized by a full-wave rectifier that performs full-wave rectification on the signal DV output from the amplification circuit 32 or an integrator that performs an integration process of an output signal of a full-wave rectifier.

The synchronization signal output circuit 52 receives the signal DV amplified by the amplification circuit and outputs the synchronization signal SYC (reference signal) to the detection circuit 60. The synchronization signal output circuit 52 can be realized by a comparator that performs a binarization process on the sinusoidal wave (alternating-wave) signal DV to generate the rectangular wave synchronization signal SYC or a phase adjustment circuit (phase shifter) that performs phase adjustment on the synchronization signal SYC.

The synchronization signal output circuit 52 outputs the signal DSFD to the diagnosis circuit 150. The signal DSFD is a signal having the same phase as the synchronization signal SYC and is generated by, for example, by a comparator which performs binarization process on the sinusoidal wave signal DV. The synchronization signal SYC itself may be output as the signal DSFD to the diagnosis circuit 150.

The detection circuit 60 includes the amplification circuit 61, the synchronization detection circuit 81, a filter unit 90, the A/D conversion circuit 100, and the DSP unit 110. The amplification circuit 61 receives the first detection signal IQ1 and the second detection signal IQ2 from the vibration piece 10 and performs charge-voltage conversion, differential signal amplification, or gain adjustment. The synchronization detection circuit 81 performs synchronization detection based on the synchronization signal SYC from the driving circuit 30. The filter unit 90 (lowpass filter) functions as a preliminary filter of the A/D conversion circuit 100. The filter unit 90 also functions as a circuit that attenuates an unnecessary signal which may not be removed through the synchronization detection. The A/D conversion circuit 100 performs the A/D conversion of the signal after the synchronization detection. The DSP unit 110 performs digital signal processing such as digital filter processing or digital correction process on the a digital signal from the A/D conversion circuit 100.

For example, the phases of the detection signals IQ1 and IQ2 which are charge signals (current signals) from the vibration piece 10 are delayed by 90 degrees than the driving signals DQ which are voltage signals. A phase in the Q/V conversion circuit or the like of the amplification circuit 61 is delayed by 90 degrees. Therefore, the phase of the signal output from the amplification circuit 61 is delayed by 180 degrees than the driving signal DQ. Accordingly, for example, by performing the synchronization detection using the synchronization signal SYC having the same phase as the driving signal DQ (DV), it is possible to remove an unnecessary signal or the like of which a phase is delayed by 90 degrees than the driving signal DQ.

The control unit 140 performs a process of controlling the circuit device 20. The control unit 140 can be realized by a logic circuit (a gate array or the like) or a processor. Control of various switches or mode setting in the circuit device 20 is performed by the control unit 140.

In FIG. 9, the configuration example of the circuit device of the digital gyro outputting a detected angular velocity as digital data is illustrated, but the embodiment is not limited thereto. A circuit device of an analog gyro outputting a detected angular velocity as an analog voltage (DC voltage) may be configured.

3. Detailed Circuit Configuration Example of Detection Circuit

Figure 10:
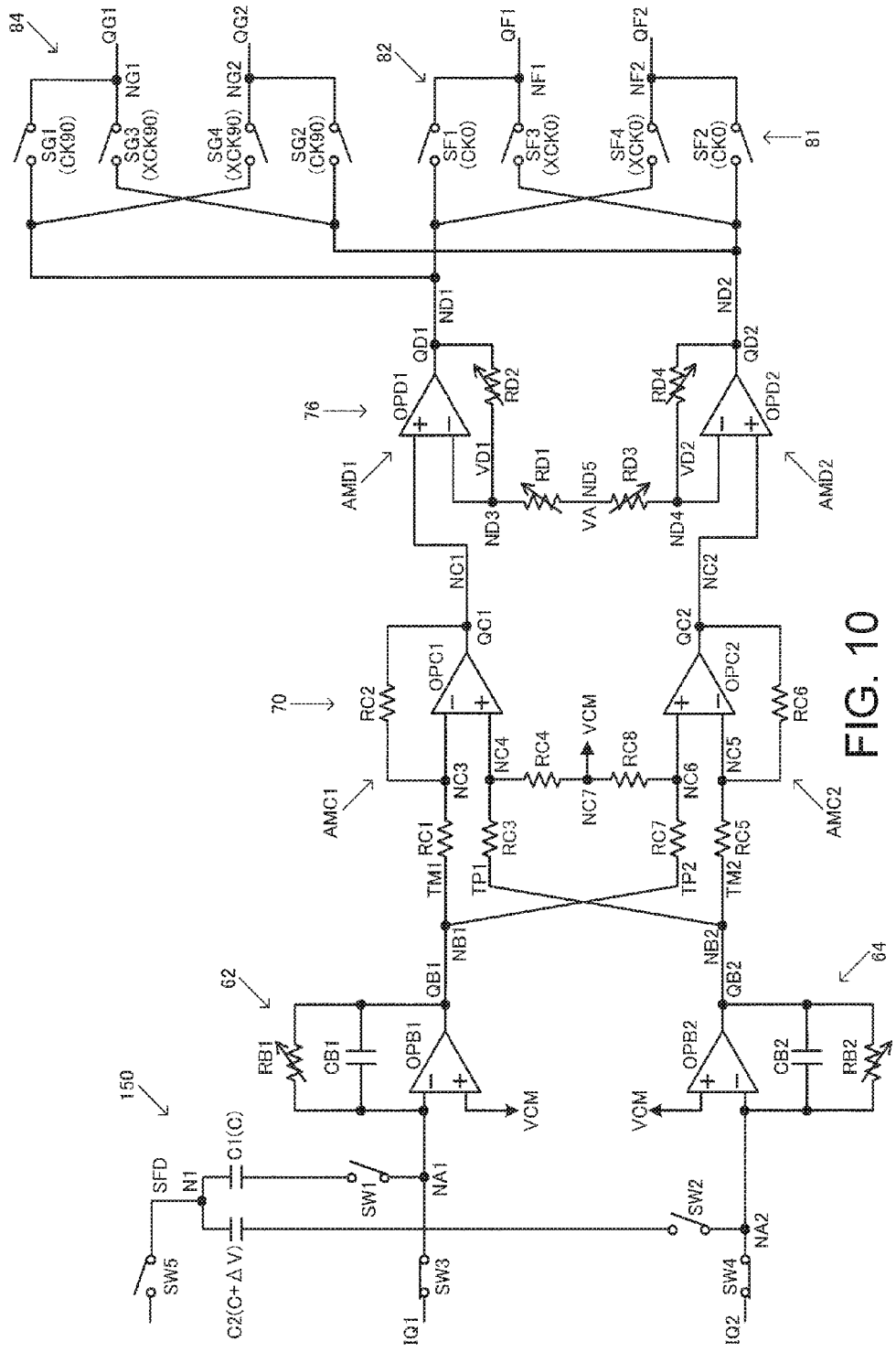
FIG. 10 is a diagram illustrating a more detailed configuration example of the detection circuit.

FIG. 10 is a diagram illustrating a more detailed configuration example of the detection circuit 60. The detection circuit 60 is not limited to the configuration in FIG. 10. According to various modification examples, some of the constituent elements can be omitted or other constituent elements can be added.

Since the configurations of the diagnosis circuit 150 and the Q/V conversion circuits 62 and 64 are described in FIG. 2 and the like, the description thereof will be omitted.

The differential amplification circuit 70 includes a first amplifier AMC1 and a second amplifier AMC2. The first amplifier AMC1 is a differential input single end output amplifier. The second amplifier AMC2 is a differential input single end output amplifier.

The first amplifier AMC1 includes a first operational amplifier OPC1 and a first resistor element RC1 to a fourth resistor element RC4.

The first resistor element RC1 is provided between an inversion input terminal TM1 (node NB1) of the first amplifier AMC1 and an inversion input terminal (node NC3) of the first operational amplifier OPC1. The second resistor element RC2 is provided between the inversion input terminal of the first operational amplifier OPC1 and an output terminal of the first operational amplifier OPC1 (an output terminal of the first amplifier AMC1 and a node NC1). That is, the first resistor element RC1 and the second resistor element RC2 are connected in series between an inversion input terminal TM1 of the first amplifier AMC1 and the output terminal (NC1) of the first operational amplifier OPC1. The signal QB1 from the Q/V conversion circuit 62 on the front stage is input to an inversion input terminal TM1 (−) of the first amplifier AMC1.

The third resistor element R3 is provided between a non-inversion input terminal TP1 (node NB2) of the first amplifier AMC1 and a non-inversion input terminal (node NC4) of the first operational amplifier OPC1. The fourth resistor element RC4 is provided between the non-inversion input terminal (NC4) of the first operational amplifier OPC1 and a node NC7 of the analog common voltage VCM. That is, the third resistor element RC3 and the fourth resistor element RC4 are connected in series between the non-inversion input terminal TP1 of the first amplifier AMC1 and the node NC7. A signal QB2 from the Q/V conversion circuit 64 on the front stage is input to the non-inversion input terminal TP1 (+) of the first amplifier AMC1.

The second amplifier AMC2 includes a second operational amplifier OPC2 and a fifth resistor element RC5 to an eighth resistor element RC8.

The fifth resistor element RC5 is provided between an inversion input terminal TM2 (node NB2) of the second amplifier AMC2 and an inversion input terminal (node NC5) of the second operational amplifier OPC2. The sixth resistor element RC6 is provided between the inversion input terminal (NC5) of the second operational amplifier OPC2 and an output terminal of the second operational amplifier OPC2 (an output terminal of the second amplifier AMC2 and a node NC2). That is, the fifth resistor element RC5 and the sixth resistor element RC6 are connected in series between an inversion input terminal TM2 of the second amplifier AMC2 and the output terminal (NC2) of the second operational amplifier OPC2. The signal QB2 from the Q/V conversion circuit 64 on the front stage is input to an inversion input terminal TM2 (−) of the second amplifier AMC2.

The seventh resistor element R7 is provided between a non-inversion input terminal TP2 (node NB1) of the second amplifier AMC2 and a non-inversion input terminal (node NC6) of the second operational amplifier OPC2. The eighth resistor element RC8 is provided between the non-inversion input terminal (NC6) of the second operational amplifier OPC2 and the node NC7 of the analog common voltage VCM. That is, the seventh resistor element RC7 and the eighth resistor element RC8 are connected in series between the non-inversion input terminal TP2 of the second amplifier AMC2 and the node NC7. The signal QB1 from the Q/V conversion circuit 62 on the front stage is input to the non-inversion input terminal TP2 of the second amplifier AMC2.

In this way, the differential amplification circuit 70 in FIG. 10 is configured by two differential input single end output amplifiers. That is, the differential amplification circuit 70 is configured by the first amplifier AMC1 of the differential input single end output in which the signal QB1 between the signals QB1 and QB2 forming the differential signals is input to the inversion input terminal TM1 (−) and the signal QB2 is input to the non-inversion input terminal TP1 (+) and the second amplifier AMC2 of the differential input single end output in which the signal QB1 is input to the non-inversion input terminal TP2 (+) and the signal QB2 is input to the inversion input terminal TM2 (−).

With such a configuration, the differential signals QC1 and QC2 of which voltages vary to the positive and negative polarities using the analog common voltage VCM (analog ground) as a reference are output from the differential amplification circuit 70. For example, the signal QC1 is a positive polarity voltage with respect to the analog common voltage VCM, the signal QC2 is a negative polarity voltage with respect to the analog common voltage VCM. When the signal QC1 is a negative polarity voltage with respect to the analog common voltage VCM, the signal QC2 is a positive polarity voltage with respect to the analog common voltage VCM.

For example, when R1 is the resistant values of the resistor elements RC1, RC3, RC5, and RC7 and R2 is the resistant values of the resistor elements RC2, RC4, RC6, and RC8, and GC is a gain of the differential amplification of the differential amplification circuit 70, a relation of GC/2=R2/R1 is established. The differential amplification circuit 70 outputs the signals QC1 and QC2 expressed as in the following expressions when the signals QB1 and QB2 are input.

$$QC1 = VCM - (GC/2) \times (QB1 - QB2)$$

$$QC2 = VCM + (GC/2) \times (QB1 - QB2)$$

$$QC1 - QC2 = -GC \times (QB1 - QB2)$$

That is, the differential amplification circuit 70 outputs the differential signals QC1 and QC2 obtained by multiplying a differential component (QB1−QB2) by a gain GC and inverting the polarity using the analog common voltage VCM as the reference. The differential amplification circuit 70 may be configured by a full-differential amplifier of normal type differential input and differential output.

In FIG. 10, a gain adjustment amplifier 76 is provided on the rear stage of the differential amplification circuit 70. When the differential signals QC1 and QC2 are input, the gain adjustment amplifier 76 amplifies these differential signals by an adjustable gain and outputs differential signals QD1 and QD2.

The gain adjustment amplifier 76 includes a first operational amplifier OPD1, a second operational amplifier OPD2, and a first resistor element RD1 to a fourth resistor element RD4.

In the first operational amplifier OPD1, the signal QC1 between the signals QC1 and QC2 (first and second signals) forming the differential signals is input to a non-inversion input terminal (first input terminal). In the second operational amplifier OPD2, the signal QC2 between the signals QC1 and QC2 is input to the non-inversion input terminal (first input terminal).

The first resistor element RD1 is provided between the first node ND5 and the inversion input terminal (a second input terminal and a node ND3) of the first operational amplifier OPD1. The second resistor element RD2 is provided between the inversion input terminal (ND3) of the first operational amplifier OPD1 and the output terminal (node ND1) of the first operational amplifier OPD1.

The first resistor element RD1 and the second resistor element RD2 function as a first voltage division circuit that performs voltage division on a voltage (VA) of the first node ND5 and a voltage (a voltage of the output signal QD1) of the output terminal of the first operational amplifier OPD1 and sets a voltage VD1 obtained by the voltage division in the inversion input terminal of the first operational amplifier OPD1.

The third resistor element RD3 is provided between the first node ND5 and the inversion input terminal (a second input terminal and a node ND4) of the second operational amplifier OPD2. The fourth resistor element RD4 is provided between the inversion input terminal (ND4) of the second operational amplifier OPD2 and the output terminal (node ND2) of the second operational amplifier OPD2.

The third resistor element RD3 and the fourth resistor element RD4 function as a second voltage division circuit that performs voltage division on a voltage (VA) of the first node ND5 and a voltage (a voltage of the output signal QD2) of the output terminal of the second operational amplifier OPD2 and sets a voltage VD2 obtained by the voltage division in the inversion input terminal of the second operational amplifier OPD2.

In this way, the gain adjustment amplifier 76 is configured by the first measurement amplifier (instrumentation amplifier) AMD1 which includes the first operational amplifier OPD1, the first resistor element RD1, and the second resistor element RD2 and the second measurement amplifier AMD2 which includes the second operational amplifier OPD2, the third resistor element RD3, and the fourth resistor element RD4. One end of the resistor element RD1 of the first measurement amplifier AMD1 and one end of the resistor element RD3 of the second measurement amplifier AMD2 are commonly connected to the node ND5.

When the differential signals QC1 and QC2 are input, the gain adjustment amplifier 76 outputs the differential signals QD1 and QD2 to the nodes ND1 and ND2.

The resistor elements RD1 to RD4 are resistor elements of which resistant values are variable. Thus, by adjusting the resistant values of the resistor elements, the gain GD is adjusted in the gain adjustment amplifier 76. For example, when R1 is the resistant values of the resistor elements RD1 and RD3, R2 is the resistant values of the resistor elements RD2 and RD4, and R is a reference resistant value, the resistant values R1 and R2 for setting with the gain GD can be expressed as R1=R/GD and R2=R×(1−1/GD). Then, when the signals QC1 and QC2 are input, the differential amplification circuit 70 outputs the signals QD1 and QD2 expressed as in the following expressions.

$$QD1=VA+(GD/2)\times(QC1-QC2)$$

$$QD2=VA-(GD/2)\times(QC1-QC2)$$

$$QD1-QD2=GD\times(QC1-QC2)$$

Here, VA is a voltage of the node ND5. VA is a voltage obtained by performing voltage division on the voltages of the signals QD1 and QD2 by the resistor elements RD1 and RD2 and the resistor elements RD3 and RD4 and is a middle point voltage of the voltages of the signals QD1 and QD2. Therefore, a relation of VA=(QD1+QD2)/2 is established. The signals QC1 and QC2 are differential signals using the analog common voltage VCM as the reference (central voltage). When a relation of VCM=(QC1+QC2)/2 is established, a relation of VA=VCM is established.

The configuration of the gain adjustment amplifier 76 may be omitted by providing the gain adjustment function in the differential amplification circuit 70.

The synchronization detection circuit 81 includes a switching mixer 82 and a switching mixer 84. The switching mixer 82 is a mixer for extraction (for an normal operation) of a desired signal (angular velocity). That is, the switching mixer 82 performs the differential synchronization detection based on the synchronization signal SYC from the driving circuit 30 to detect the desired signal. The switching mixer 84 is a mixer for extraction (diagnosis) of an unnecessary signal.

For example, by arbitrarily generating a vibration leakage signal in the vibration piece 10 and causing the switching mixer 84 to detect the vibration leakage signal, the fault diagnosis of the detection circuit 60 is performed.

For example, in FIG. 8, when vibration energies of both the driving arms 4 and 5 and the driving arms 6 and 7 are balanced at the time of the bending vibration of these driving arms, the detection arms 8 and 9 do not perform the bending vibration in a state in which an angular velocity is not applied to the vibration piece 10. Conversely, when the vibration energies of both the driving arms 4 and 5 and the driving arms 6 and 7 are not balanced, the bending vibration of the detection arms 8 and 9 occurs even in the state in which no angular velocity is applied to the vibration piece 10. The bending vibration is referred to as leakage vibration and is bending vibration in the direction of the arrow C as in the vibration based on the Coriolis force. The vibration (the detection signals IQ1 and IQ2) based on the Coriolis force is vibration with a phase deviated by 90 degrees from the driving signal DQ, but the leakage vibration is vibration with the same phase as the driving signal DQ. Since the phase is deviated by 90 degrees in the Q/V conversion circuits 62 and 64, a signal based on the leakage vibration is a signal with a phase deviated by 90 degrees from the synchronization signal SYC in the step of the synchronization detection.

In the embodiment, the vibration energies of the driving arms 4 and 5 and the driving arms 6 and 7 are not slightly balanced, a vibration leakage component with a desired level is actively generated. For example, by discriminating mass using weight portions of the front ends of the driving arms 4 and 5 and weight portions of the front ends of the driving arms 6 and 7 through laser processing or the like, the vibration energies are unbalanced to arbitrarily generate vibration leakage. Since the level of the vibration leakage serves as a known value. Therefore, by detecting a signal of the vibration leakage by the switching mixer 84, it is possible to perform fault diagnosis of the detection circuit 60.

In the switching mixer 82, the signal QD1 from the gain adjustment amplifier 76 on the front stage is input to the first input node ND1 and the signal QD2 is input to the second input node ND2. Then, the differential synchronization detection is performed using the synchronization signal SYC (CK0) from the driving circuit 30, and differential signals QF1 and QF2 are output to a first output node NF1 and a second output node NF2.

The switching mixer 82 includes switch elements SF1, SF2, SF3, and SF4. The switch element SF1 is provided between the first output node NF1 and the first input node ND1 of the switching mixer 82. The switch element SF2 is provided between the second output node NF2 and the second input node ND2 of the switching mixer 82. The switch element SF3 is provided between the first output node NF1 and the second input node ND2. The switch element SF4 is provided between the second output node NF2 and the first input node ND1. The switch elements SF1 to SF4 can be configured by, for example, MOS transistors (for example, NMOS type transistors or transfer gates).

The switch elements SF1 and SF2 are turned on or off by a clock signal CK0 and the switch elements SF3 and SF4 are turned on or off by a clock signal XCK0. The clock signal CK0 corresponds to the above-described synchronization signal SYC and the clock signal XCK0 is an inverted signal (a signal of which a phase is different by 180 degrees) of the clock signal CK0. Accordingly, the switch elements SF1 and SF3 are exclusively turned on or off and the switch elements SF2 and SF4 are exclusively turned on or off. For example, when the clock signal CK0 (SYC) is at an H level (a first voltage level in a broad sense), the switch elements SF1 and SF2 are turned on and the switch elements SF3 and SF4 are turned off. When the clock signal CK0 (SYC) is at an L level (a second voltage level in a broad sense), the switch elements SF1 and SF2 are turned off and the switch elements SF3 and SF4 are turned on.

Accordingly, the differential signals QD1 and QD2 from the gain adjustment amplifier 76 are subjected to the synchronization detection in the differential signal state, and the signals after the synchronization detection are output as the differential signals QF1 and QF2. The switching mixer 82 performs frequency conversion on an unnecessary signal such as noise (1/f noise) generated by the circuit (the Q/V conversion circuit, the differential amplification circuit, or the gain adjustment amplifier) on the front stage to convert the unnecessary signal into a high-frequency band. The desired signal which is a signal according to the Coriolis force is dropped to a direct-current signal. Then, the unnecessary signal such as the 1/f noise of which a frequency is converted into the high-frequency band by the switching mixer 82 is removed by the filter unit 90 (see FIG. 9) provided on the rear stage. The filter unit 90 is a passive filter configured by, for example, a passive element. That is, a passive filter configured by a passive element such as a resistor element or a capacitor can be adopted as the filter unit 90 without using an operational amplifier.

In the switching mixer 84, the signal QD1 from the gain adjustment amplifier 76 on the front stage is input to the first input node ND1 and the signal QD2 is input to the second input node ND2. Then, the differential signals QG1 and QG2 are output to the first output node NG1 and the second output node NG2.

The switching mixer 84 includes switch elements SG1, SG2, SG3, and SG4. The switch element SG1 is provided between the first input node ND1 and the first output node NG1. The switch element SG2 is provided between the second input node ND2 and the second output node NG2. The switch element SG3 is provided between the second input node ND2 and the first output node NG1. The switch element SG4 is provided between the first input node ND1 and the second output node NG2. The switch elements SG1 to SG4 can be configured by, for example, MOS transistors (for example, NMOS type transistors or transfer gates).

The switch elements SG1 and SG2 are turned on or off by a clock signal CK90 and the switch elements SG3 and SG4 are turned on or off by a clock signal XCK90. The clock signal CK90 is a signal of which a phase is different by 90 degrees from the clock signal CK0 (the synchronization signal SYC). The clock signal XCK90 is an inverted signal (a signal of which a phase is different by 180 degrees) of the clock signal CK90. Accordingly, the switch elements SG1 and SG3 are exclusively turned on or off and the switch elements SF2 and SF4 are exclusively turned on or off. For example, when the clock signal CK90 is at the H level, the switch elements SG1 and SG2 are turned on and the switch elements SG3 and SG4 are turned off. When the clock signal CK90 is at the L level, the switch elements SG1 and SG2 are turned off and the switch elements SG3 and SG4 are turned on.

The phases of the vibration leakage signal (an unnecessary signal in a broad sense) arbitrarily generated in the vibration piece 10 and the synchronization signal SYC (the desired signal) are different by 90 degrees. Accordingly, the switching mixer 84 can extract the arbitrarily mixed vibration leakage signal by detecting the synchronization of the signals QD1 and QD2 based on the clock signal CK0 which is the synchronization signal SYC and the clock signal CK90 with the phase different by 90 degrees. Since the level of the vibration leakage signal is known, a detection result by the switching mixer 84 can be subjected to A/D conversion to be compared to an expected value, so that it can be detected that the expected vibration leakage signal is mixed in QD1 and QD2. When the expected vibration leakage signal is detected, it can be determined that the detection circuit 60 normally operates. The diagnosis process using the switching mixer 84 is performed during the period of the regular diagnosis illustrated in FIG. 6.

Figure 11:
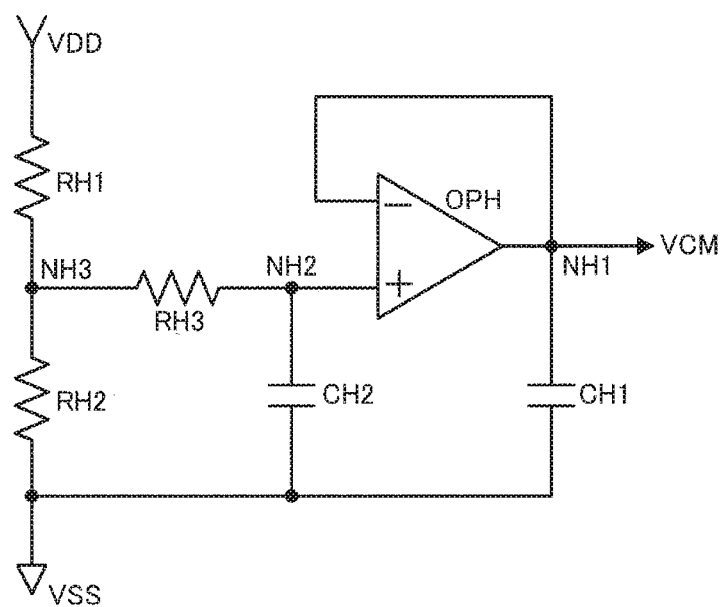
FIG. 11 is a diagram illustrating a configuration example of an analog common voltage generation circuit.

FIG. 11 is a diagram illustrating a configuration example of an analog common voltage generation circuit generating the VCM. The analog common voltage generation circuit includes an operational amplifier OPH, resistor elements RH1, RH2, and RH3, and capacitors CH1 and CH2. The resistor elements RH1 and RH2 are connected in series between power supplies VDD and VSS and generate a division voltage in anode NH3. The division voltage is a central voltage between, for example, VDD and VSS. The division voltage is supplied to a node NH2 of a non-conversion input terminal of the operational amplifier OPH via a lowpass filter for noise reduction configured by the resistor element RH3 and the capacitor CH2. The operational amplifier OPH is connected in a so-called voltage follower manner and outputs a voltage corresponding to the division voltage as an analog common voltage VCM to the node NH1. The capacitor CH1 is a capacitor for potential stabilization.

4. Moving Object and Electronic Apparatuses

Figure 12B:
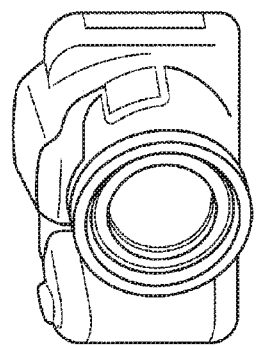
FIGS. 12A to 12D are diagrams illustrating a moving object and electronic apparatuses in which the circuit device according to the embodiment is embedded.
Figure 12D:
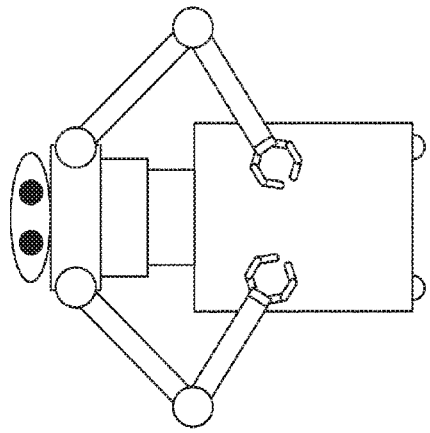
Figure 12A:
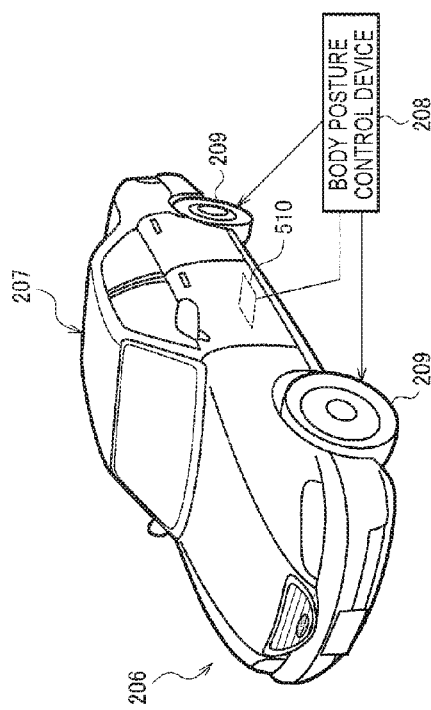

FIG. 12A is a diagram illustrating an example of a moving object including the circuit device 20 according to the embodiment. The circuit device 20 according to the embodiment can be embedded in, for example, in any of various moving objects such as a vehicle, an air plane, a motor bicycle, a bicycle, and a ship. A moving object is a machinery or an apparatus that includes a driving mechanism such as an engine or a motor, a steering mechanism such as a handle or a rudder, or any of various electronic apparatus and moves on the ground, on the sea, or in the air. FIG. 12A schematically illustrates an automobile 206 as a specific example of the moving object. In the automobile 206, a gyro sensor 510 (sensor) including the vibration piece 10 and the circuit device 20 is embedded. The gyro sensor 510 can detect the posture of a body 207. A detected signal of the gyro sensor 510 is supplied to a body posture control device 208. The body posture control device 208 can control, for example, hardness and softness of a suspension according to the posture of the body 207 or control a brake of an individual vehicle wheel 209. Besides, such posture control can be used in any of various moving objects such as a bipedal walking robot, an air plane, and a helicopter. The posture control is realized so that the gyro sensor 510 can be embedded.

Figure 12C:
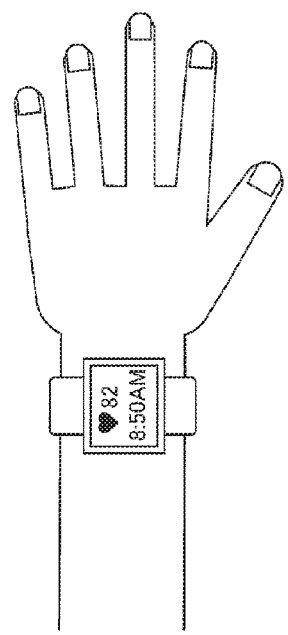

As illustrated in FIGS. 12B and 12C, the circuit device according to the embodiment can be applied to any of various electronic apparatuses such as digital still cameras and biological information detection apparatuses (wearable health apparatuses; for example, a pulsimeter, a pedometer, and an active amount meter). For example, in a digital still camera, camera-shake correction or the like can be performed using a gyro sensor or an acceleration sensor. In a biological information detection apparatus, a body motion or an exercise state of a user can be detected using a gyro sensor or an acceleration sensor. As illustrated in FIG. 12D, the circuit device according to the embodiment can also be applied to a movable portion (an arm or a joint) or a body portion of a robot. The robot can be assumed to be any of a moving object (running or walking robot) or an electronic apparatus (non-running or non-walking robot). When the robot is a running or walking robot, the circuit device according to the embodiment can be use in, for example, autonomous travelling.

The embodiments have been described in detail above, but it should be easily understood by those skilled in the art that modification examples can be made in various ways without actually departing from the novelty and advantages of the invention. Accordingly, the modification examples are all included in the scope of the invention. For example, in the present specification and the drawings, terms (the gyro sensor, the vibration piece, and the like) described along with other broader and identical terms (the physical quantity detection device, the physical quantity transducer, and the like) can be substituted with the other terms in any portion of the present specification and the drawings at least once. The configurations of the circuit device, the physical quantity detection device, the electronic apparatus, or the moving object and the configuration of the vibration piece can also be modified in various ways without being limited to the configurations described in the embodiments.

The entire disclosure of Japanese Patent Application No. 2015-051697, filed Mar. 16, 2015 is expressly incorporated by reference herein.

What is claimed is:
1. A circuit device comprising:
 a detection circuit to which first and second detection signals forming differential signals are input from a physical quantity transducer;
 a diagnosis circuit of the detection circuit;
 a first terminal to which the first detection signal is input; and a second terminal to which the second detection signal is input,
wherein the detection circuit includes
a first charge/voltage conversion circuit to which the first detection signal is input via a first input node provided between the first terminal and the first charge/voltage conversion circuit, and
a second charge/voltage conversion circuit to which the second detection signal is input via a second input node provided between the second terminal and the second charge/voltage conversion circuit, and
wherein the diagnosis circuit includes
a first capacitor which is provided between a first node and the first input node,
a first switch element provided between the first capacitor and the first input node,
a second capacitor which is provided between the first node and the second input node and has a different capacitor value from the first capacitor, and
a second switch element provided between the second capacitor and the second input node, and
wherein in a diagnosis mode, a diagnosis signal is input to the first node.

2. The circuit device according to claim 1,
wherein the diagnosis circuit includes
a third switch element which is provided between the first terminal and the first input node, and
a fourth switch element which is provided between the second terminal and the second input node.

3. The circuit device according to claim 2,
wherein in the diagnosis mode, the first and second switch elements are turned on and the third and fourth switch elements are turned off.

4. The circuit device according to claim 2, further comprising:
a driving circuit which drives the physical quantity transducer,
wherein a signal based on a signal from the driving circuit is input as the diagnosis signal to the first node.

5. The circuit device according to claim 3,
wherein during a normal operation period in which the detection circuit performs a detection operation, the first and second switch elements are turned off and the third and fourth switch elements are turned on.

6. The circuit device according to claim 3,
wherein after supply of power and before a normal operation period in which the detection circuit performs a detection operation, the first and second switch elements are turned on.

7. The circuit device according to claim 3, further comprising:
a driving circuit which drives the physical quantity transducer,
wherein a signal based on a signal from the driving circuit is input as the diagnosis signal to the first node.

8. The circuit device according to claim 5,
wherein after supply of power and before the normal operation period in which the detection circuit performs the detection operation, the first and second switch elements are turned on.

9. The circuit device according to claim 5, further comprising:
a driving circuit which drives the physical quantity transducer,
wherein a signal based on a signal from the driving circuit is input as the diagnosis signal to the first node.

10. The circuit device according to claim 1,
wherein after supply of power and before a normal operation period in which the detection circuit performs a detection operation, the first and second switch elements are turned on.

11. The circuit device according to claim 1, further comprising:
a control unit that performs control such that the first and second switch elements are turned on or off,
wherein after supply of power and before a normal operation period in which the detection circuit performs a detection operation, the control unit turns on the first and second switch elements.

12. The circuit device according to claim 1, further comprising:
a driving circuit which drives the physical quantity transducer,
wherein a signal based on a signal from the driving circuit is input as the diagnosis signal to the first node.

13. The circuit device according to claim 12,
wherein a signal obtained by converting a voltage level of the signal from the driving circuit is input as the diagnosis signal to the first node.

14. The circuit device according to claim 12,
wherein the detection circuit includes a synchronization detection circuit which performs synchronization detection based on a synchronization signal from the driving circuit, and
wherein the diagnosis signal is a signal having the same phase as the synchronization signal.

15. The circuit device according to claim 12,
wherein the detection circuit includes a differential amplification circuit which is provided on a rear side of the first and second charge/voltage conversion circuits and performs differential amplification on signals output from the first and second charge/voltage conversion circuits.

16. The circuit device according to claim 1,
wherein a detection result in the detection circuit in the diagnosis mode is output.

17. The circuit device according to claim 16, further comprising:
a register unit which outputs the detection result,
wherein the detection circuit includes an A/D conversion circuit which performs A/D conversion on a detection result signal in the detection circuit, and
wherein in the register unit, diagnosis result data obtained by performing the A/D conversion on the detection result signal in the diagnosis mode is set as the detection result.

18. A physical quantity detection device comprising:
the circuit device according to claim 1; and
a physical quantity transducer.

19. An electronic apparatus comprising:
the circuit device according to claim 1.

20. A moving object comprising:
the circuit device according to claim 1.

* * * * *